United States Patent
Hoang et al.

(10) Patent No.: US 11,657,259 B2
(45) Date of Patent: May 23, 2023

(54) KERNEL TRANSFORMATION TECHNIQUES TO REDUCE POWER CONSUMPTION OF BINARY INPUT, BINARY WEIGHT IN-MEMORY CONVOLUTIONAL NEURAL NETWORK INFERENCE ENGINE

(71) Applicant: SanDisk Technologies LLC, Addison, TX (US)

(72) Inventors: Tung Thanh Hoang, San Jose, CA (US); Won Ho Choi, San Jose, CA (US); Martin Lueker-Boden, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 629 days.

(21) Appl. No.: 16/722,580

(22) Filed: Dec. 20, 2019

(65) Prior Publication Data

US 2021/0192325 A1    Jun. 24, 2021

(51) Int. Cl.
*G06N 3/04*    (2023.01)
*G06N 3/063*    (2023.01)
(Continued)

(52) U.S. Cl.
CPC ............. *G06N 3/063* (2013.01); *G06F 7/523* (2013.01); *G06N 3/04* (2013.01); *G11C 11/54* (2013.01);
(Continued)

(58) Field of Classification Search
CPC ....... G06F 7/523; G11C 11/54; G11C 13/004; G11C 13/0069; G06N 3/04; G06N 3/063; G06N 3/08
See application file for complete search history.

(56) References Cited

U.S. PATENT DOCUMENTS 7,324,366 B2    1/2008    Bednorz et al.
7,505,347 B2    3/2009    Rinerson et al.
(Continued)

FOREIGN PATENT DOCUMENTS

CN    110597555 A    12/2019
CN    110598858 A    12/2019
(Continued)

OTHER PUBLICATIONS

International Search Report & The Written Opinion of the International Searching Authority dated Jul. 30, 2020, International Application No. PCT/US2020/024615.
(Continued)

*Primary Examiner* — Kurtis R Bahr
(74) *Attorney, Agent, or Firm* — Vierra Magen Marcus LLP

(57) ABSTRACT

Techniques are presented for performing in-memory matrix multiplication operations for binary input, binary weight valued convolution neural network (CNN) inferencing. The weights of a filter are stored in pairs of memory cells of a storage class memory device, such as a ReRAM or phase change memory based devices. To reduce current consumption, the binary valued filters are transformed into ternary valued filters by taking sums and differences of binary valued filter pairs. The zero valued weights of the transformed filters are stored as a pair of high resistance state memory cells, reducing current consumption during convolution. The results of the in-memory multiplications are pair-wise combined to compensate for the filter transformations. To compensate for zero valued weights, a zero weight register stores the number of zero weights along each bit line and is used to initialize counter values for accumulating the multiplication operations.

19 Claims, 25 Drawing Sheets

(51) Int. Cl.
  *G11C 13/00*   (2006.01)
  *G06F 7/523*   (2006.01)
  *G11C 11/54*   (2006.01)
  *G06N 3/08*    (2023.01)

(52) U.S. Cl.
  CPC ........ *G11C 13/004* (2013.01); *G11C 13/0069* (2013.01); *G06N 3/08* (2013.01)

(56) References Cited

U.S. PATENT DOCUMENTS

| | | |
|---|---|---|
| 8,416,624 B2 | 4/2013 | Lei et al. |
| 8,634,247 B1 | 1/2014 | Sprouse et al. |
| 8,634,248 B1 | 1/2014 | Sprouse et al. |
| 8,773,909 B2 | 7/2014 | Li et al. |
| 8,780,632 B2 | 7/2014 | Sprouse et al. |
| 8,780,633 B2 | 7/2014 | Sprouse et al. |
| 8,780,634 B2 | 7/2014 | Sprouse et al. |
| 8,780,635 B2 | 7/2014 | Li et al. |
| 8,792,279 B2 | 7/2014 | Li et al. |
| 8,811,085 B2 | 8/2014 | Sprouse et al. |
| 8,817,541 B2 | 8/2014 | Li et al. |
| 9,098,403 B2 | 8/2015 | Sprouse et al. |
| 9,104,551 B2 | 8/2015 | Spouse et al. |
| 9,116,796 B2 | 8/2015 | Sprouse et al. |
| 9,384,126 B1 | 7/2016 | Sprouse et al. |
| 9,430,735 B1 | 8/2016 | Vali et al. |
| 9,887,240 B2 | 2/2018 | Shimabukuro et al. |
| 10,127,150 B2 | 11/2018 | Sprouse et al. |
| 10,249,360 B1 | 4/2019 | Chang et al. |
| 10,459,724 B2 | 10/2019 | Yu et al. |
| 10,528,643 B1* | 1/2020 | Choi ................. G11C 7/1006 |
| 10,535,391 B2 | 1/2020 | Osada et al. |
| 2014/0133228 A1 | 5/2014 | Sprouse et al. |
| 2014/0133233 A1 | 5/2014 | Li et al. |
| 2014/0133237 A1 | 5/2014 | Sprouse et al. |
| 2014/0136756 A1 | 5/2014 | Sprouse et al. |
| 2014/0136757 A1 | 5/2014 | Sprouse et al. |
| 2014/0136758 A1 | 5/2014 | Sprouse et al. |
| 2014/0136760 A1 | 5/2014 | Sprouse et al. |
| 2014/0136762 A1 | 5/2014 | Li et al. |
| 2014/0136763 A1 | 5/2014 | Li et al. |
| 2014/0136764 A1 | 5/2014 | Li et al. |
| 2014/0156576 A1 | 6/2014 | Nugent |
| 2014/0136761 A1 | 7/2014 | Li et al. |
| 2014/0294272 A1 | 10/2014 | Madabhushi et al. |
| 2015/0324691 A1 | 11/2015 | Dropps et al. |
| 2016/0026912 A1 | 1/2016 | Falcon et al. |
| 2017/0098156 A1 | 4/2017 | Nino et al. |
| 2017/0228637 A1 | 8/2017 | Santoro et al. |
| 2018/0039886 A1 | 2/2018 | Umuroglu et al. |
| 2018/0075339 A1 | 3/2018 | Ma et al. |
| 2018/0082181 A1 | 3/2018 | Brothers et al. |
| 2018/0144240 A1 | 5/2018 | Garbin et al. |
| 2018/0315473 A1* | 11/2018 | Yu ......................... G06N 3/063 |
| 2018/0357533 A1 | 12/2018 | Inoue |
| 2019/0065896 A1* | 2/2019 | Lee ........................ G06V 10/82 |
| 2019/0087715 A1 | 3/2019 | Jeng |
| 2019/0102359 A1 | 4/2019 | Knag et al. |
| 2019/0108436 A1 | 4/2019 | David et al. |
| 2019/0221257 A1 | 7/2019 | Jeng et al. |
| 2019/0251425 A1 | 8/2019 | Jaffari et al. |
| 2019/0280694 A1 | 9/2019 | Obradovic et al. |
| 2020/0034686 A1* | 1/2020 | Chiu ................. G11C 11/5685 |
| 2020/0034697 A1* | 1/2020 | Choi ....................... G06N 3/08 |
| 2020/0035305 A1* | 1/2020 | Choi ...................... G11C 11/54 |
| 2020/0202203 A1 | 6/2020 | Nakayama et al. |
| 2020/0234137 A1 | 7/2020 | Chen et al. |
| 2020/0301668 A1* | 9/2020 | Li ........................... G11C 11/54 |
| 2020/0311523 A1* | 10/2020 | Hoang ................... G06F 7/496 |
| 2021/0110244 A1* | 4/2021 | Hoang .................. G06F 17/16 |
| 2021/0192325 A1 | 6/2021 | Hoang et al. |
| 2022/0100508 A1 | 3/2022 | Pawlowski |
| 2022/0179703 A1 | 6/2022 | Vincent |

FOREIGN PATENT DOCUMENTS

| | | |
|---|---|---|
| JP | 2016/042359 A | 3/2016 |
| KR | 10-2019-009467 A | 8/2019 |

OTHER PUBLICATIONS

Chiu, Pi-Feng, et al., "A Binarized Neural Network Accelerator with Differential Crosspoint Memristor Array for Energy-Efficient MAC Operations," 2019 IEEE International Symposium on Circuits and Systems (ISCAS), May 2019, Abstract only.
Sun, Xiaoyu, et al., "Low-VDD Operation of SRAM Synaptic Array for Implementing Ternary Network," IEEE Transactions on Very Large Scale Integration (VLSI) Systems, vol. 25, No. 10, Jul. 2017, Abstract only.
Kim, Hyeonuk, et al., "NAND-Net: Minimizing Computational Complexity of In-Memory Processing for Binary Neural Networks," 2019 IEEE International Symposium on High Performance Computer Architecture (HPCA), Mar. 2019, Abstract only.
English Abstract of KR Publication No. KR 10-2019-0094679 published Aug. 14, 2019.
International Search Report & The Written Opinion of the International Searching Authority dated Jul. 9, 2020, International Application No. PCT/US2020/024612.
Houxiang Ji, et al., "RECOM: an Efficient Resistive Accelerator for Compressed Deep Neural Networks," in 2018 Design, Automation & Test in Europe Conference & Exhibition, Mar. 23, 2018, Abstract only.
Yang, Tzu-Hsien, et al., "Sparse ReRAM Engine: Joint Exploration of Activation and Weight Sparsity in Compressed Neural Networks," Computer Architecture, pp. 236-249, Jun. 26, 2019, Abstract only.
International Search Report & The Written Opinion of the International Searching Authority dated Sep. 11, 2020, International Application No. PCT/US2020/024625.
English Abstract of JP Publication No. JP2016/042359 published Mar. 31, 2016.
Rastegari, Mohammad et al., "XNOR-Net: ImageNet Classification Using Binary Convolutional Neural Networks," proceedings ECCV 2016, Aug. 2016, 55 pages.
Wan, Diwen, et al., "TBN: Convolutional Neural Network with Ternary Inputs and Binary Weights," ECCV 2018, Oct. 2018, 18 pages.
Chen, Yu-Hsin, et al., "Eyeriss: an Energy-Efficient Reconfigurable Accelerator for Deep Convolutional Neural Networks," IEEE Journal of Solid-State Circuits, Feb. 2016, 12 pages.
Sun, Xiaoyu, et al., "Fully Parallel RRAM Synaptic Array for Implementing Binary Neural Network with (+1,−1) Weights and (+1, 0) Neurons," 23rd Asia and South Pacific Design Automation Conference, Jan. 2018, 6 pages.
Gonugondla, Sujan K., et al., "Energy-Efficient Deep in-memory Architecture for NAND Flash Memories," IEEE International Symposium on Circuits and Systems (ISCAS), May 2018, 5 pages.
Nakahara, Hiroki, et al., "A Memory-Based Realization of a Binarized Deep Convolutional Neural Network," International Conference on Field-Programmable Technology (FPT), Dec. 2016, 4 pages.
Takeuchi, Ken, "Data-Aware NAND Flash Memory for Intelligent Computing with Deep Neural Network," IEEE International Electron Devices Meeting (IEDM), Dec. 2017, 4 pages.
Mochida, Reiji, et al., "A 4M Synapses integrated Analog ReRAM based 66.5 TOPS/W Neural-Network Processor with Cell Current Controlled Writing and Flexible Network Architecture," Symposium on VLSI Technology Digest of Technical Papers, Jun. 2018, 2 pages.
Chiu, Pi-Feng, et al., "A Differential 2R Crosspoint RRAM Array With Zero Standby Current," IEEE Transactions on Circuits and Systems—II: Express Briefs, vol. 62, No. 5, May 2015, 5 pages.
Chen, Wei-Hao, et al., "A 65nm 1Mb Nonvolatile Computing-in-Memory ReRAM Macro with Sub-16ns Mulitply-and-Accumulate for Binary DNN AI Edge Processors," IEEE International Solid-State Circuits Conference, Feb. 2018, 3 pages.

(56) References Cited

OTHER PUBLICATIONS

Liu, Rui, et al., "Parallelizing SRAM Arrays with Customized Bit-Cell for Binary Neural Networks," DAC '18, Jun. 2018, 6 pages.
Courbariaux, Matthieu, et al., "Binarized Neural Networks: Training Neural Networks with Weights and Activations Constrained to +1 or −1," arXiv.org, Mar. 2016, 11 pages.
Simon, Noah, et al., "A Sparse-Group Lasso," Journal of Computational and Graphical Statistics, vol. 22, No. 2, pp. 231-245, downloaded by Moskow State Univ. Bibliote on Jan. 28, 2014.
"CS231n Convolutional Neural Networks for Visual Recognition," [cs231.github.io/neural-networks-2/#reg], downloaded on Oct. 15, 2019, pp. 1-15.
Krizhevsky, Alex, et al., "ImageNet Classification with Deep Convolutional Neural Networks," [http://code.google.com/p/cuda-convnet/], downloaded on Oct. 15, 2019, 9 pages.
Shafiee, Ali, et al., "ISAAC: a Convolutional Neural Network Accelerator with In-Situ Analog Arithmetic in Crossbars," ACM/IEEE 43rd Annual International Symposium on Computer Architecture (ISCA), Oct. 5, 2016, 13 pages.
Han, Song, et al., "Learning both Weights and Connections for Efficient Neural Networks," Conference paper, NIPS, Oct. 2015, 9 pages.
Jia, Yangqing, "Learning Semantic Image Representations at a Large Scale," Electrical Engineering and CS, University of Berkeley, Technical Report No. UCB/EECS-2014-93, May 16, 2014, 104 pages.
Wen, Wei, et al., "Learning Structured Sparsity in Deep Neural Networks," 30th Conference on Neural Information Processing Systems (NIPS 2016), Nov. 2016, 9 pages.
Wang, Peiqi, et al., "SNrram: an Efficient Sparse Neural Network Computation Architecture Based on Resistive Random-Access Memory," DAC '18, Jun. 24-29, 2018, 6 pages.
Zheng, Shixuan, et al., "An Efficient Kernel Transformation Architecture for Binary-and Ternary-Weight Neural Network Inference," DAC 18, Jun. 24-29, 2018, 6 pages.
U.S. Appl. No. 62/702,713, filed Jul. 24, 2018.
U.S. Appl. No. 16/368,441, filed Mar. 28, 2019.
U.S. Appl. No. 16/653,346, filed Oct. 15, 2019.
U.S. Appl. No. 16/653,365, filed Oct. 15, 2019.
Resch, Salonik, et al., "PIMBALL: Binary Neural Networks in Spintronic Memory," ACM Trans. Arch. Code Optim., vol. 37, No. 4, Article 111, Aug. 2018, 25 pages.
Zamboni, Maurizio, et al., "In-Memory Binary Neural Networks," Master's Thesis, Politecino Di Torino, Apr. 10, 2019, 327 pages.
Natsui, Masanori, et al., "Design of an energy-efficient XNOR gate based on MTJ-based nonvolatile logic-in-memory architecture for binary neural network hardware," Japanese Journal of Applied Physics 58, Feb. 2019, 8 pages.
First Action Interview Pilot Program Pre-Interview Communication dated Oct. 7, 2022, U.S. Appl. No. 16/653,365, filed Oct. 15, 2019.
Notice of Allowance dated Oct. 14, 2022, U.S. Appl. No. 16/653,346, filed Oct. 15, 2019.
Non-final Office Action dated Jun. 23, 2022, U.S. Appl. No. 16/653,346, filed Oct. 15, 2019.
Restriction Requirement dated May 26, 2022, U.S. Appl. No. 16/653,365, filed Oct. 15, 2019.
Response to Restriction Requirement dated Aug. 24, 2022, U.S. Appl. No. 16/653,365, filed Oct. 15, 2019.
Response to Office Action dated Sep. 8, 2022, U.S. Appl. No. 16/653,346, filed Oct. 15, 2019.

\* cited by examiner

| Case | Input (IN) | Weight (W) | Output (IN*W) |
|---|---|---|---|
| 0 | -1 | +1 | -1 |
| 1 | +1 | +1 | +1 |
| 2 | -1 | -1 | +1 |
| 3 | +1 | -1 | -1 |

| Case | In | WL | WLB | W | $R_A$ | $R_B$ | $V_O$ | O |
|---|---|---|---|---|---|---|---|---|
| 0 | -1 | 0 | V | +1 | LRS | HRS | $V_L$ | -1 |
| 1 | +1 | V | 0 | +1 | LRS | HRS | $V_H$ | +1 |
| 2 | -1 | 0 | V | -1 | HRS | LRS | $V_H$ | +1 |
| 3 | +1 | V | 0 | -1 | HRS | LRS | $V_L$ | -1 |

Figure 15

| Case | Input | | | cell pair/synapse | | | Output | | |
|---|---|---|---|---|---|---|---|---|---|
| | WL | WLB | Logic | $R_A$ | $R_B$ | Logic | $V_{BL}$ | $I_{BL}$ | |
| 0 | 0 | V | -1 | LRS | HRS | +1 | LOW | Small Icell | |
| 1 | V | 0 | +1 | LRS | HRS | +1 | HIGH | Large Icell | |
| 2 | 0 | V | -1 | HRS | LRS | -1 | HIGH | Large Icell | |
| 3 | V | 0 | +1 | HRS | LRS | -1 | LOW | Small Icell | |
| 4 | 0 | V | -1 | HRS | HRS | 0 | LOW | Small Icell | |
| 5 | V | 0 | +1 | HRS | HRS | 0 | LOW | Small Icell | |

KERNEL TRANSFORMATION TECHNIQUES TO REDUCE POWER CONSUMPTION OF BINARY INPUT, BINARY WEIGHT IN-MEMORY CONVOLUTIONAL NEURAL NETWORK INFERENCE ENGINE

CROSS-REFERENCE TO RELATED APPLICATIONS

This is related to U.S. patent application Nos. 16/653,346, filed Oct. 15, 2019 and issued as U.S. Pat. No. 11,568,200 on Jan. 31, 2023 and 16/653,365, filed Oct. 15, 2019 and issued as U.S. Pat. No. 11,625,586 on Apr. 11, 2023, both of which are incorporated herein by reference.

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. Although such neural networks can provide highly accurate results, they are extremely computationally intensive, and the data transfers involved in reading the weights connecting the different layers out of memory and transferring these weights into the processing units of a processing unit can be quite intensive.

BRIEF DESCRIPTION OF THE DRAWING

Like-numbered elements refer to common components in the different figures.

In some embodiments, the Front End Processor Circuit is part of a Controller.

Figure 3:
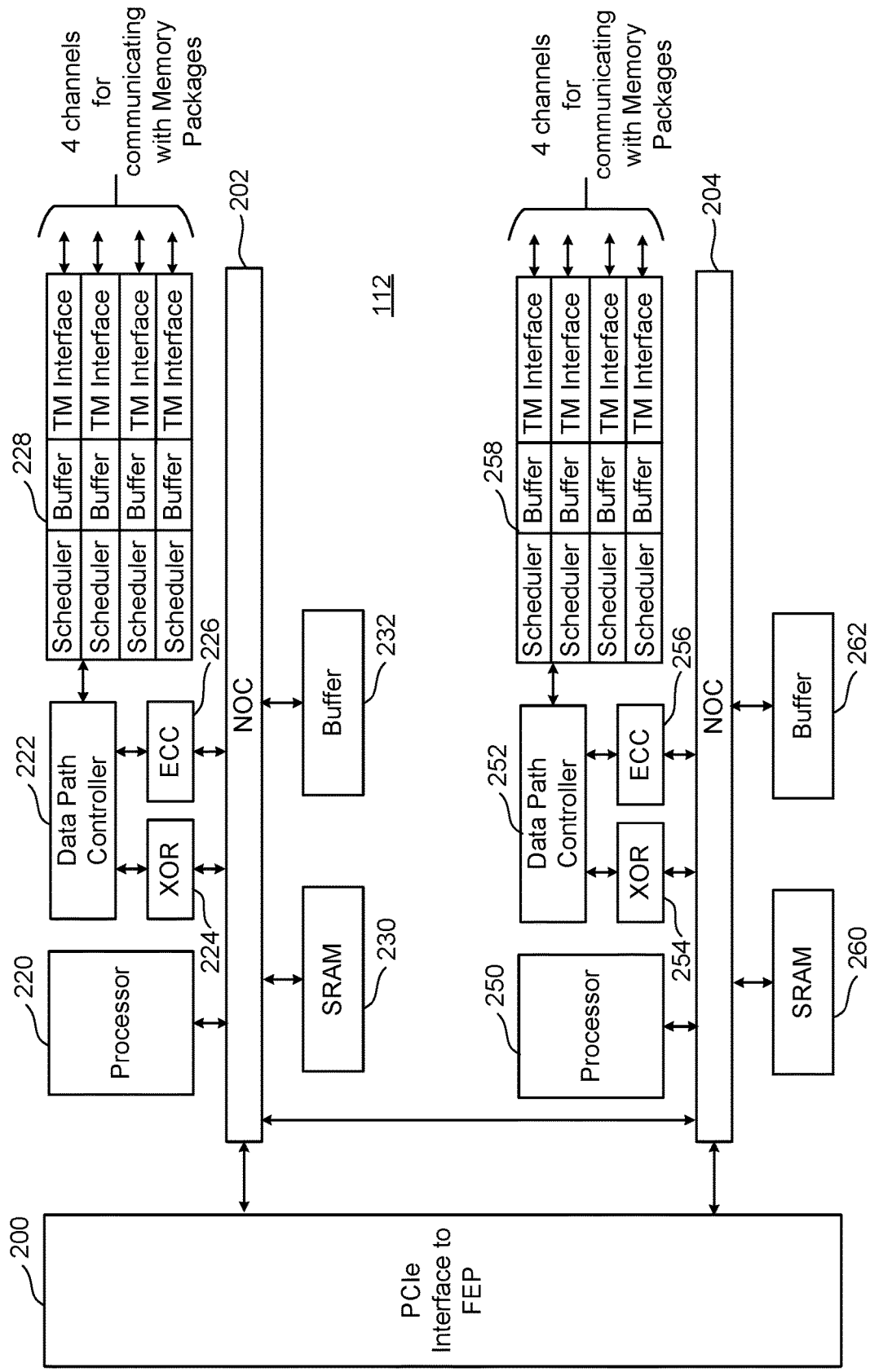

FIG. 3 is a block diagram of one embodiment of a Back End Processor Circuit.

In some embodiments, the Back End Processor Circuit is part of a Controller.

Figure 4:
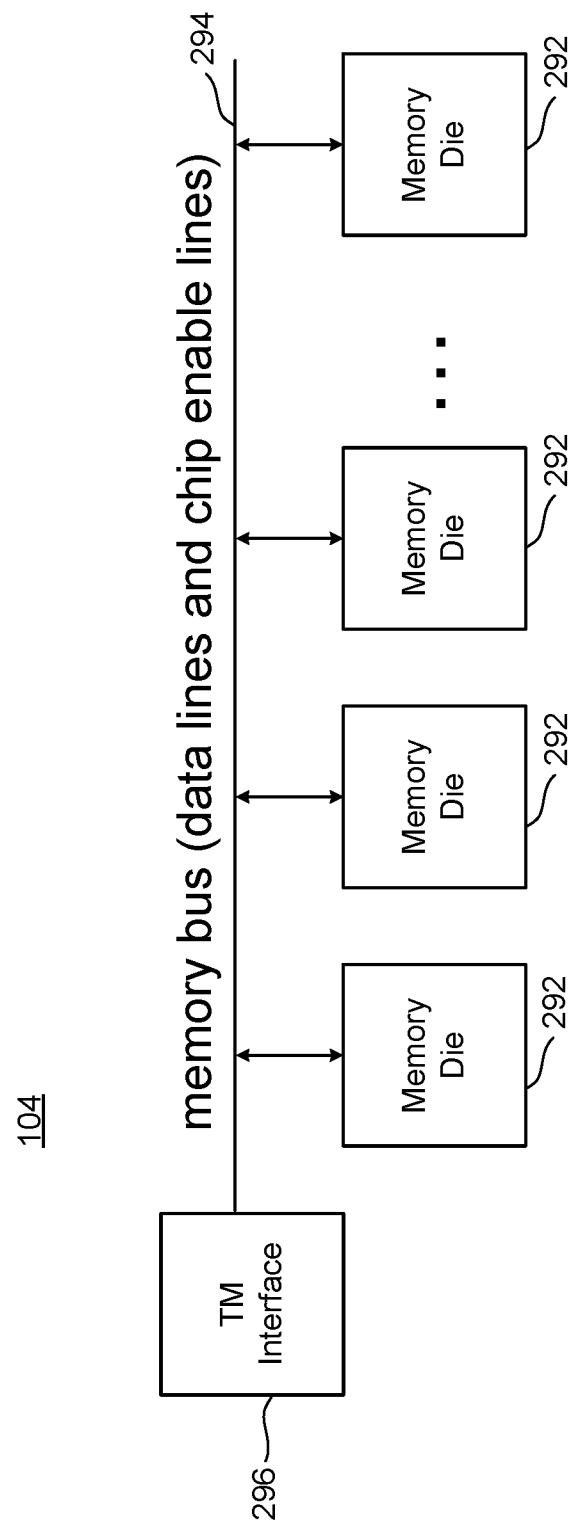

FIG. 4 is a block diagram of one embodiment of a memory package.

Figure 5:
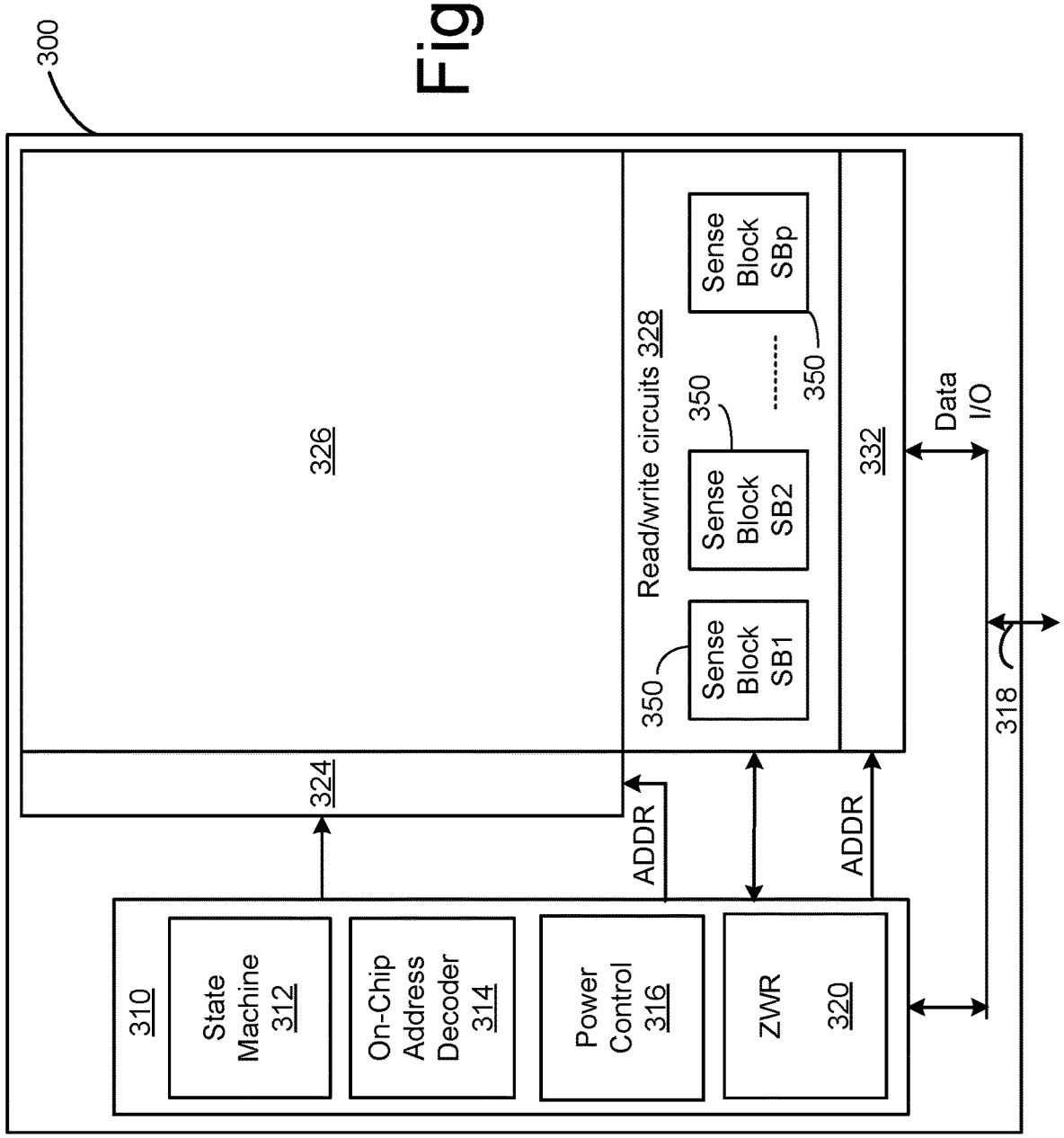

FIG. 5 is a block diagram of one embodiment of a memory die.

Figure 6:
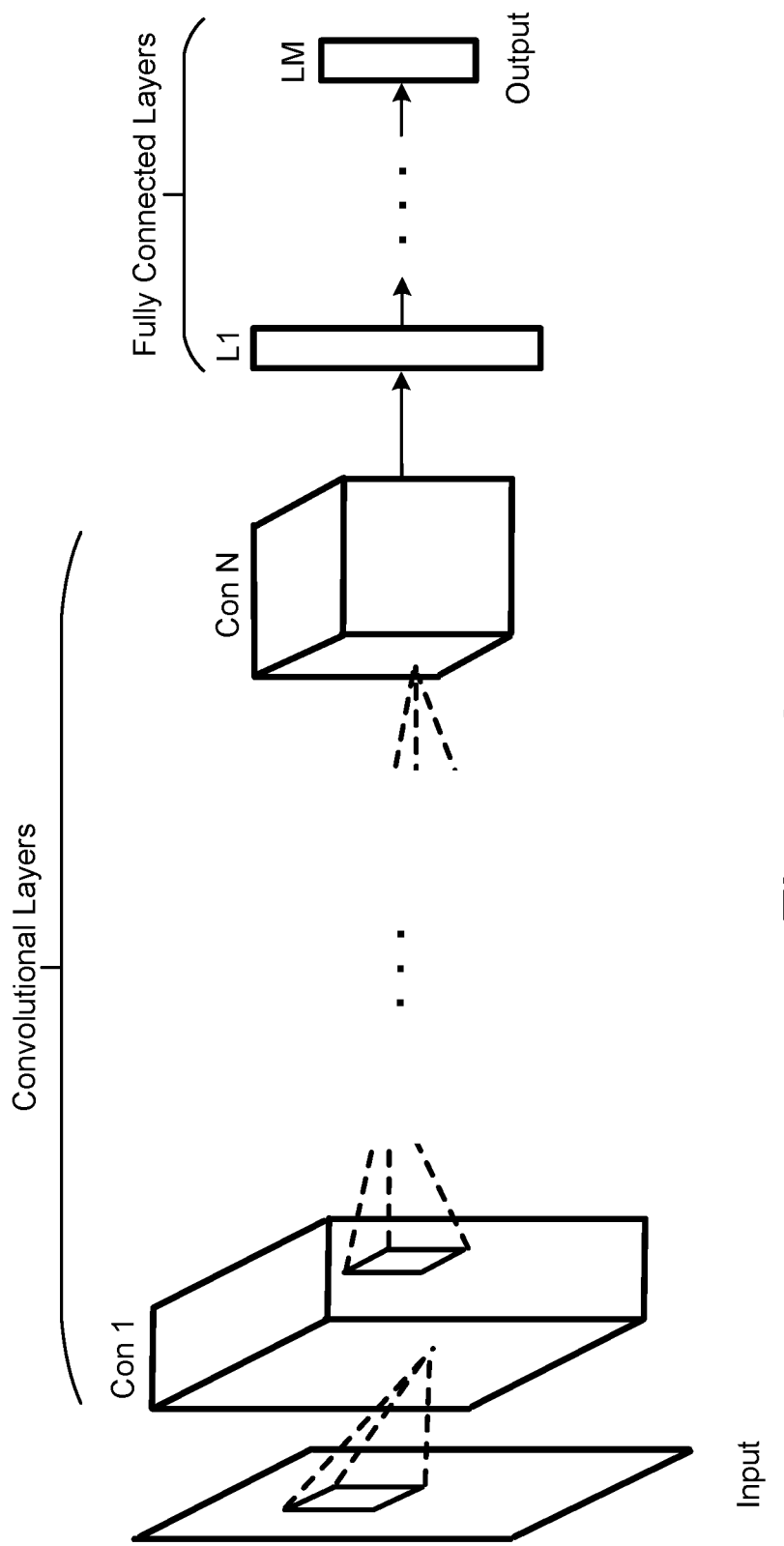

FIG. 6 illustrates a simple example of a convolutional neural network (CNN).

Figure 7B:
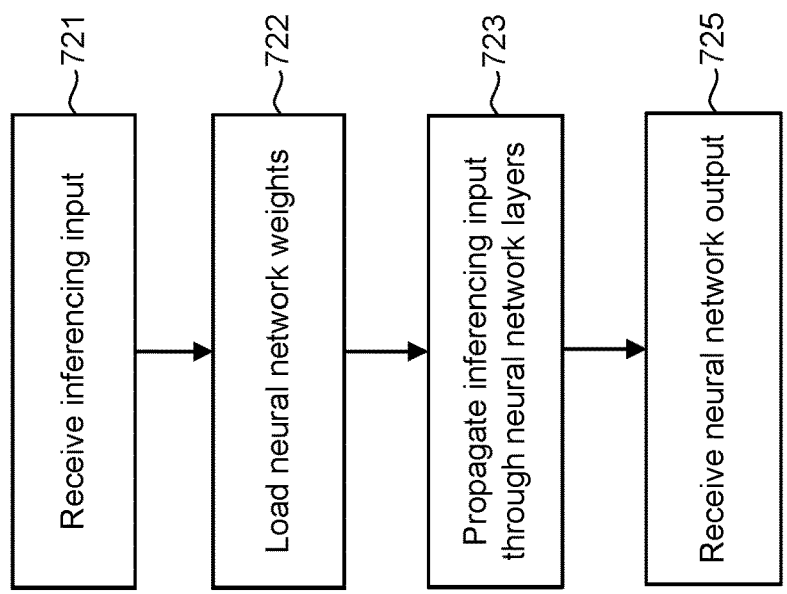
Figure 7A:
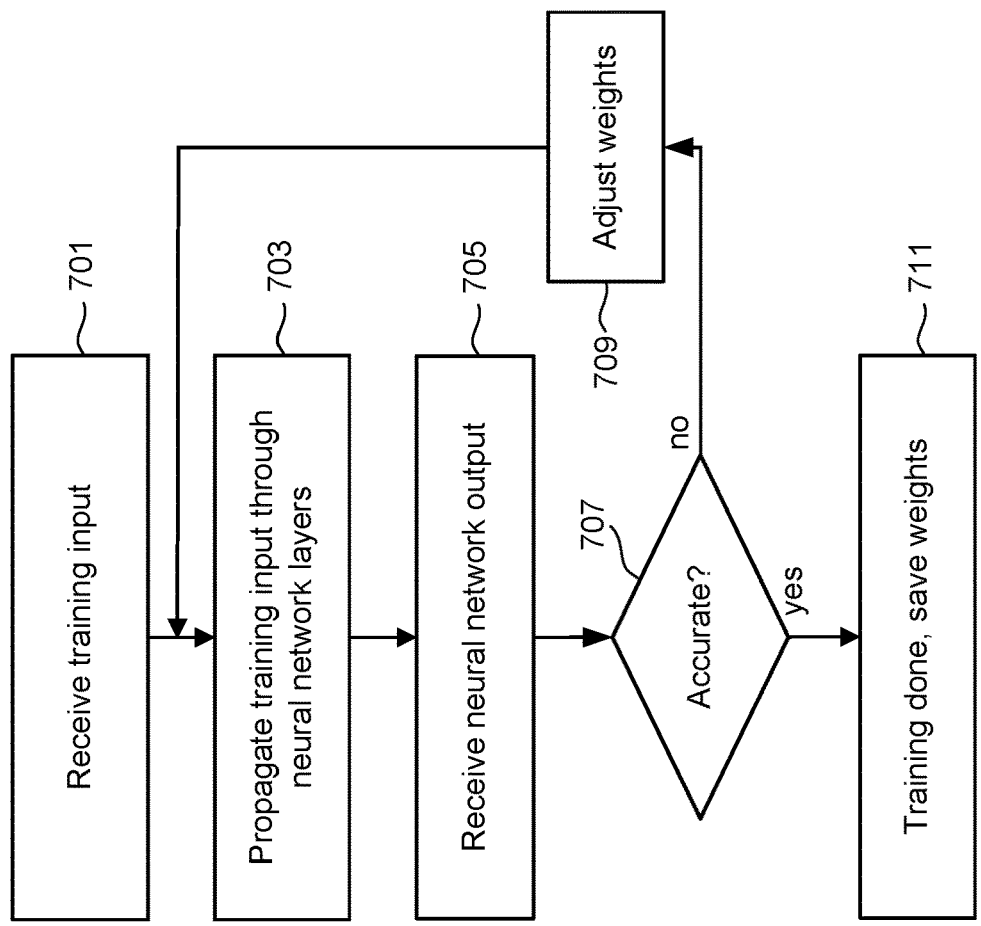

FIG. 7A is a flowchart describing one embodiment of a process for training a neural network to generate a set of weights.

FIG. 7B is a flowchart describing one embodiment of a process for inference using a neural network.

Figure 8:
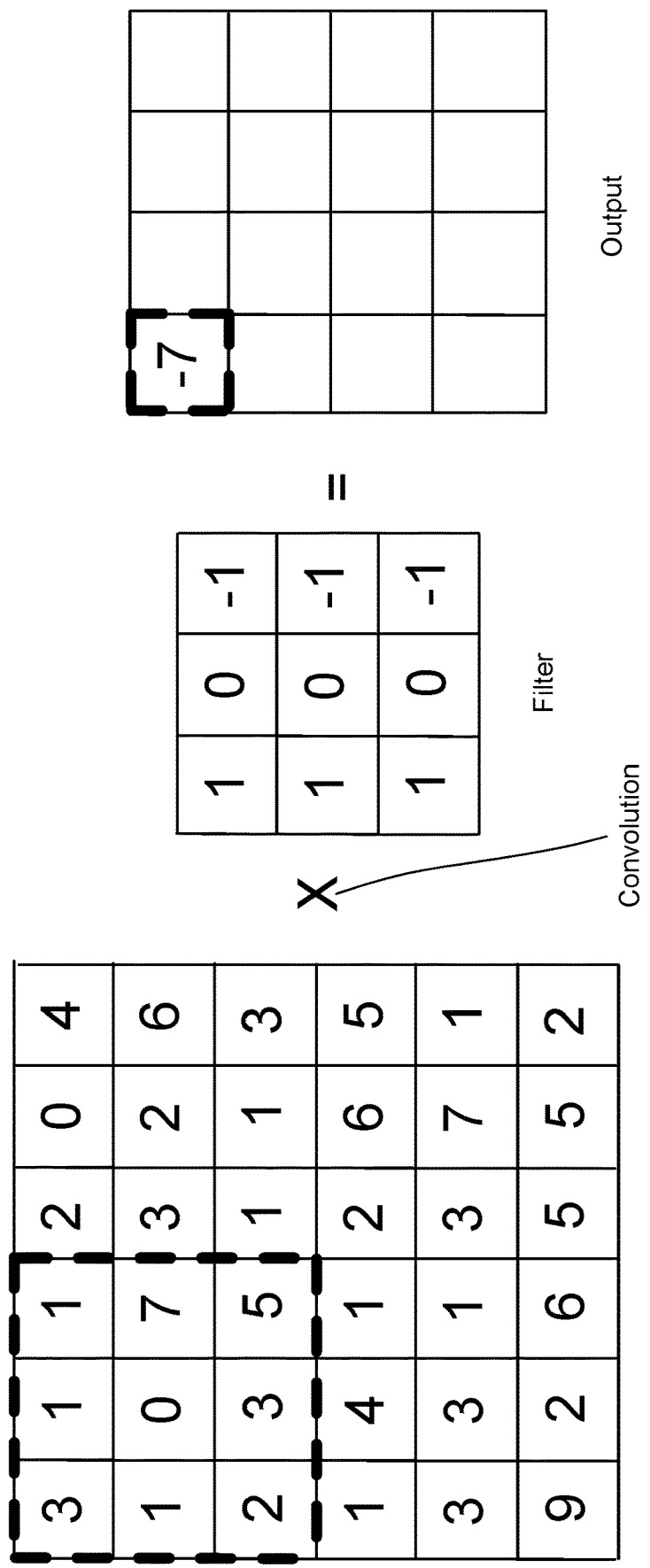

FIG. 8 is a schematic representation of a convolution operation in a convolutional neural network.

Figure 9:
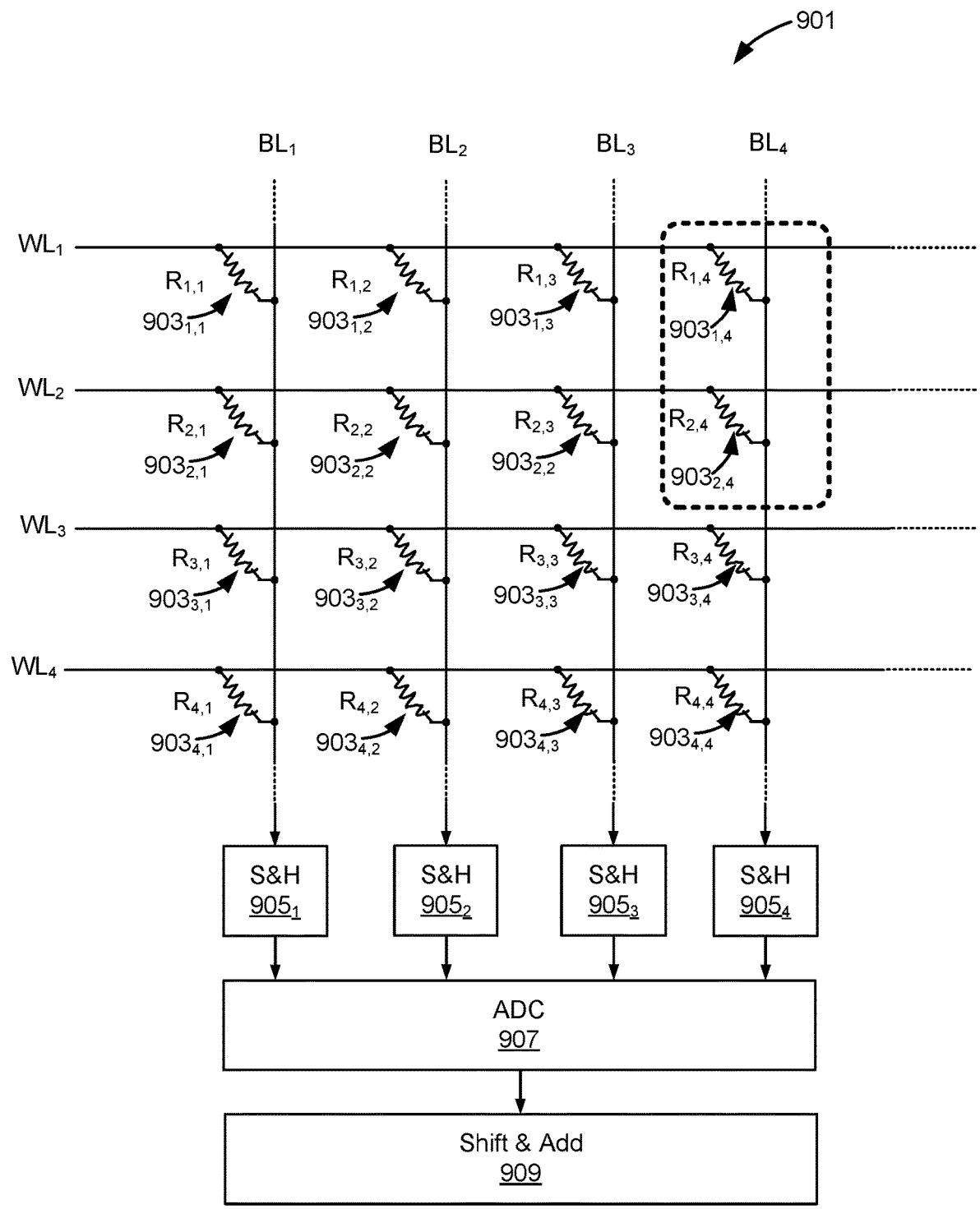
Figure 10:
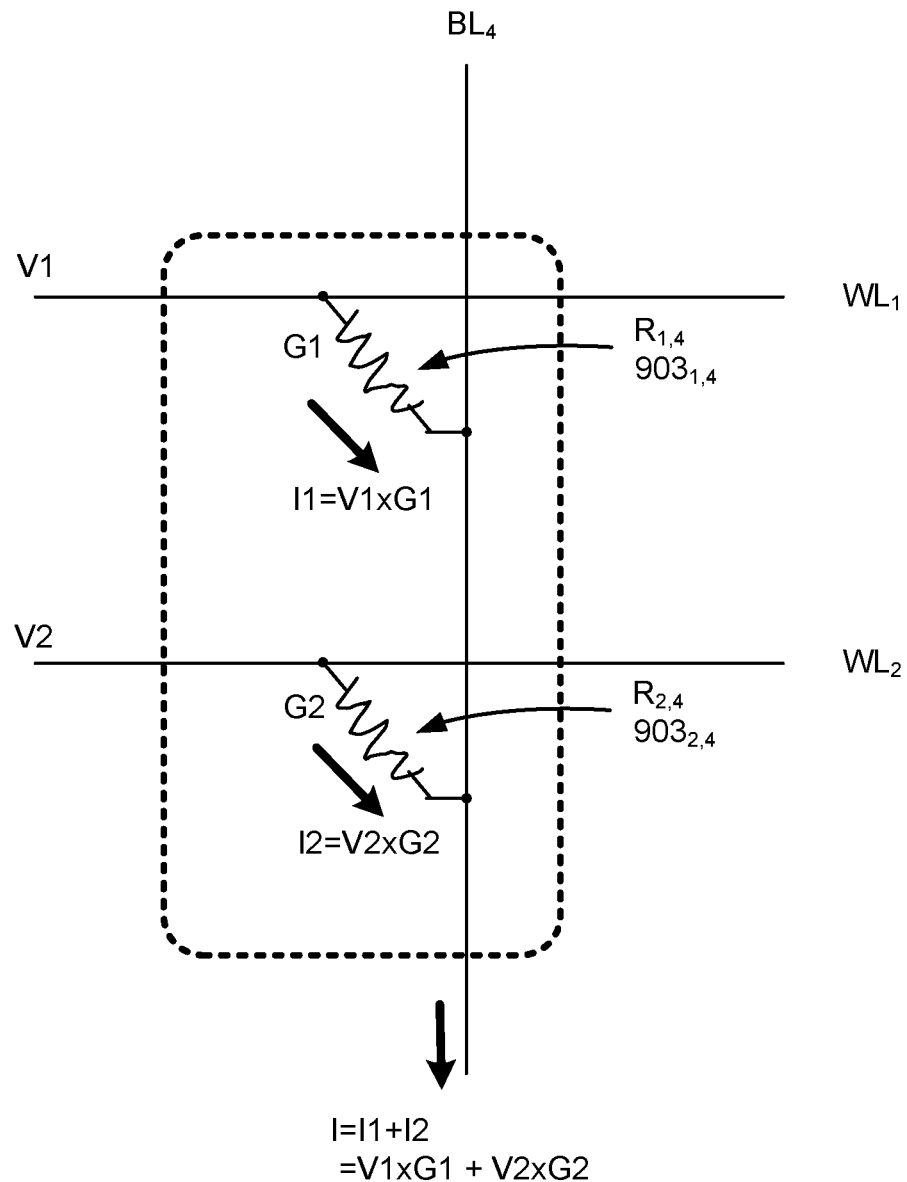

FIGS. 9 and 10 illustrate the use of storage class memory for implementing in-array matrix multiplication.

Figure 11:
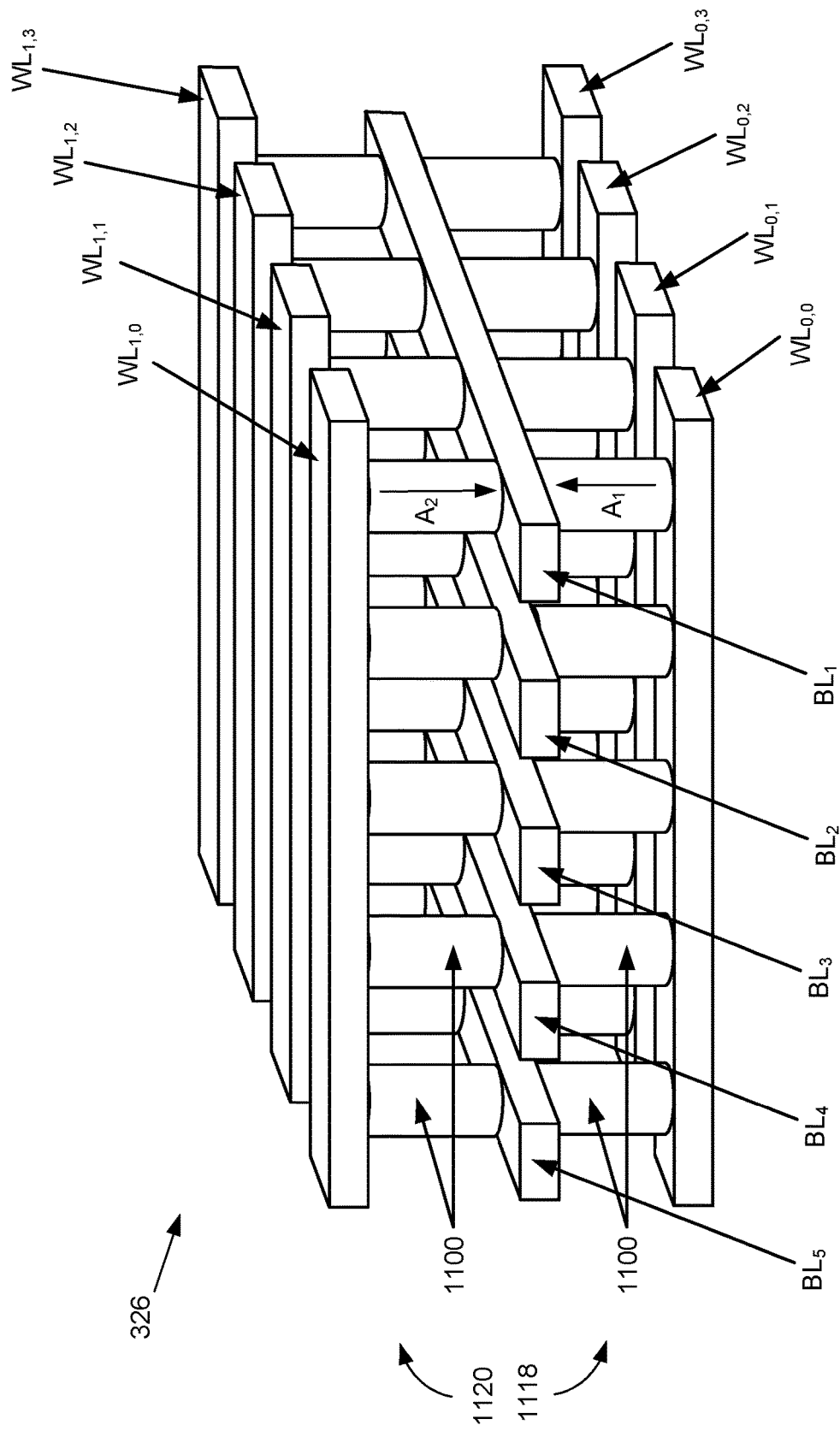

FIG. 11 depicts one embodiment of a portion of a monolithic three-dimensional memory array that forms a differential cross-point (DX) architecture.

Figure 12:
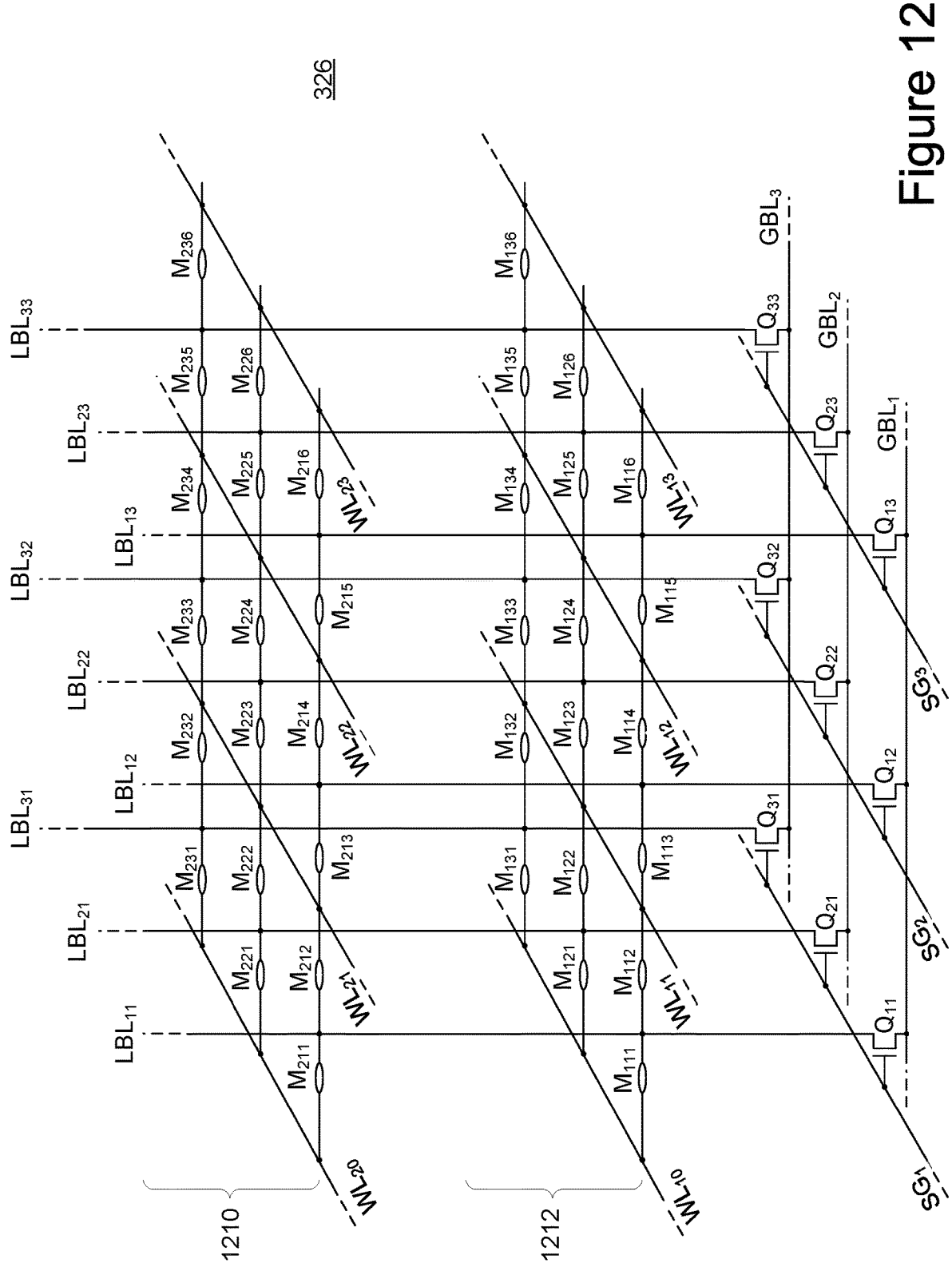

FIG. 12 provides an embodiment using an extended three dimensional structure for the storage of neural network weights.

Figures 13, 14:
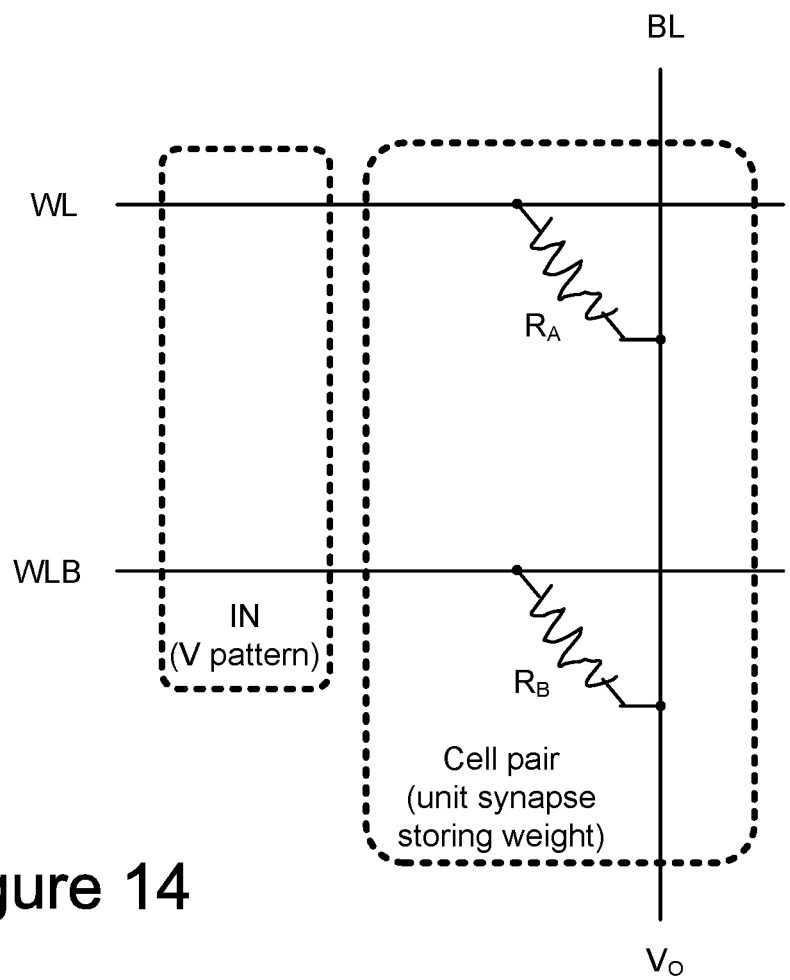

FIG. 13 is a table illustrating the output of a binary neural network in response to the different input-weight combinations.

FIG. 14 represents an embodiment where a memory cell pair is used for storing a binary weight of a filter for a convolutional neural network.

FIG. 15 illustrates the encoding of the input values, weight values, and output values as word line voltages, resistance values, and bit line voltages, respectively, for use as an in-memory CNN inference engine.

FIGS. 16A-16D respectively correspond to the four cases illustrated in the four lines of FIG. 15.

Figure 17:
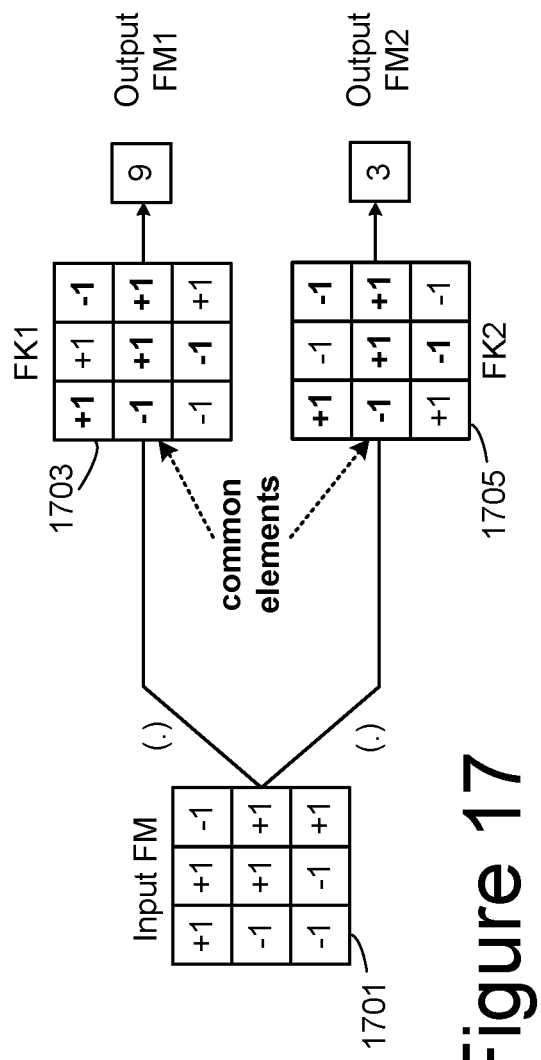
Figure 18:
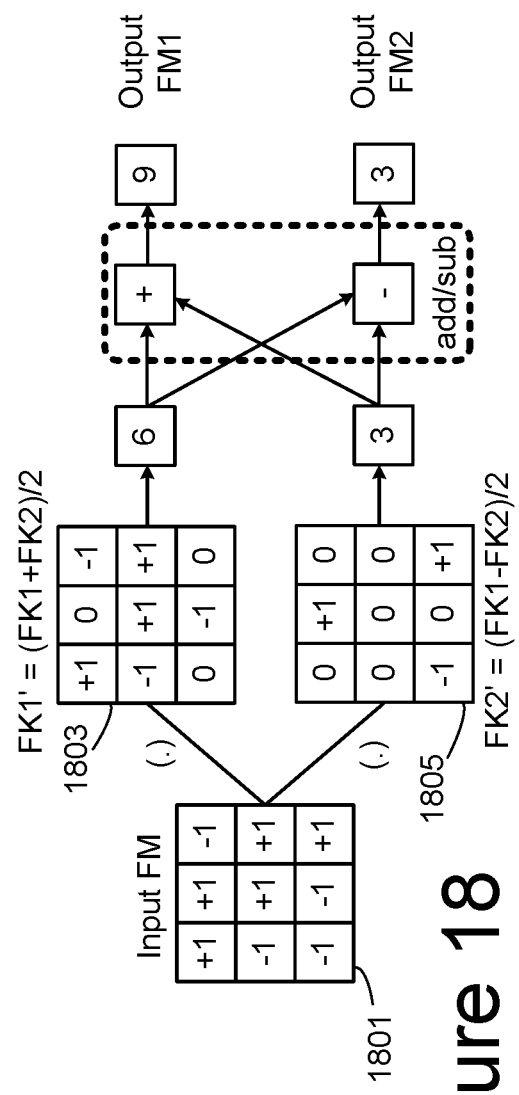

FIGS. 17 and 18 illustrate an example of a kernel transformation for convolutional computation using binary input and binary weights for the filter.

FIG. 19 presents a table illustrating an embodiment for the mapping of ternary weight values of the transformed filter kernels into storage class memory cells.

Figure 20:
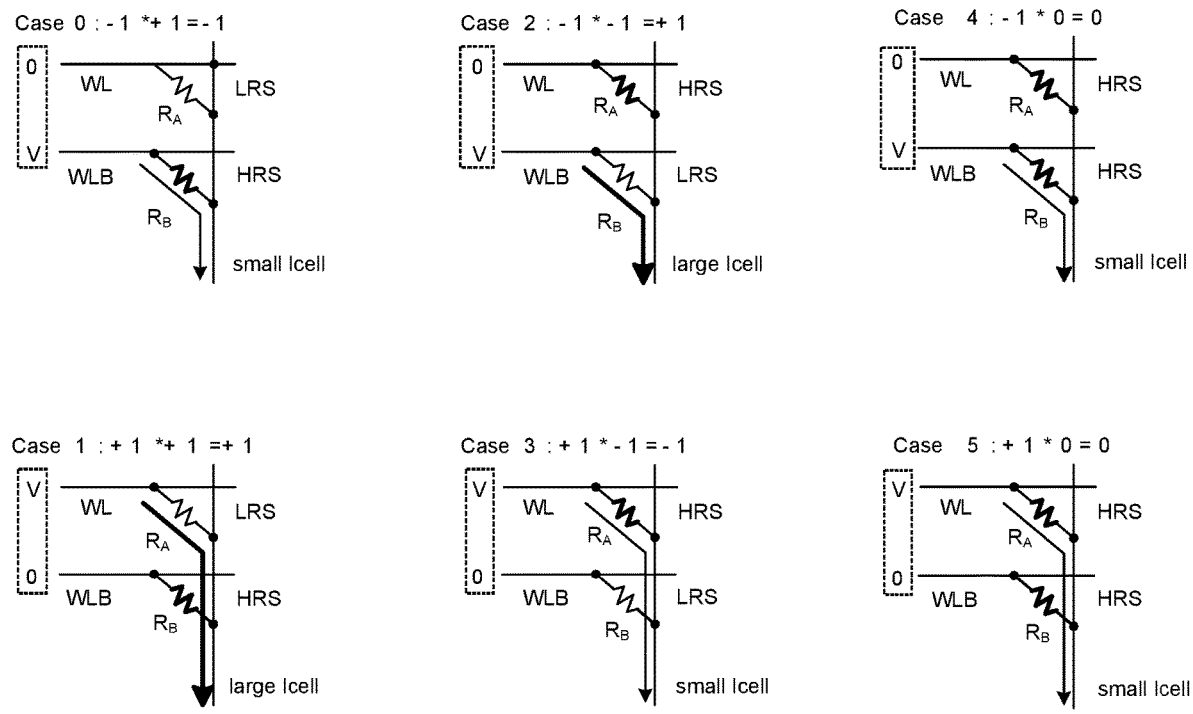

FIG. 20 illustrates how the different cases of FIG. 19 are implemented on memory cell pairs along a shared bit line.

Figure 21:
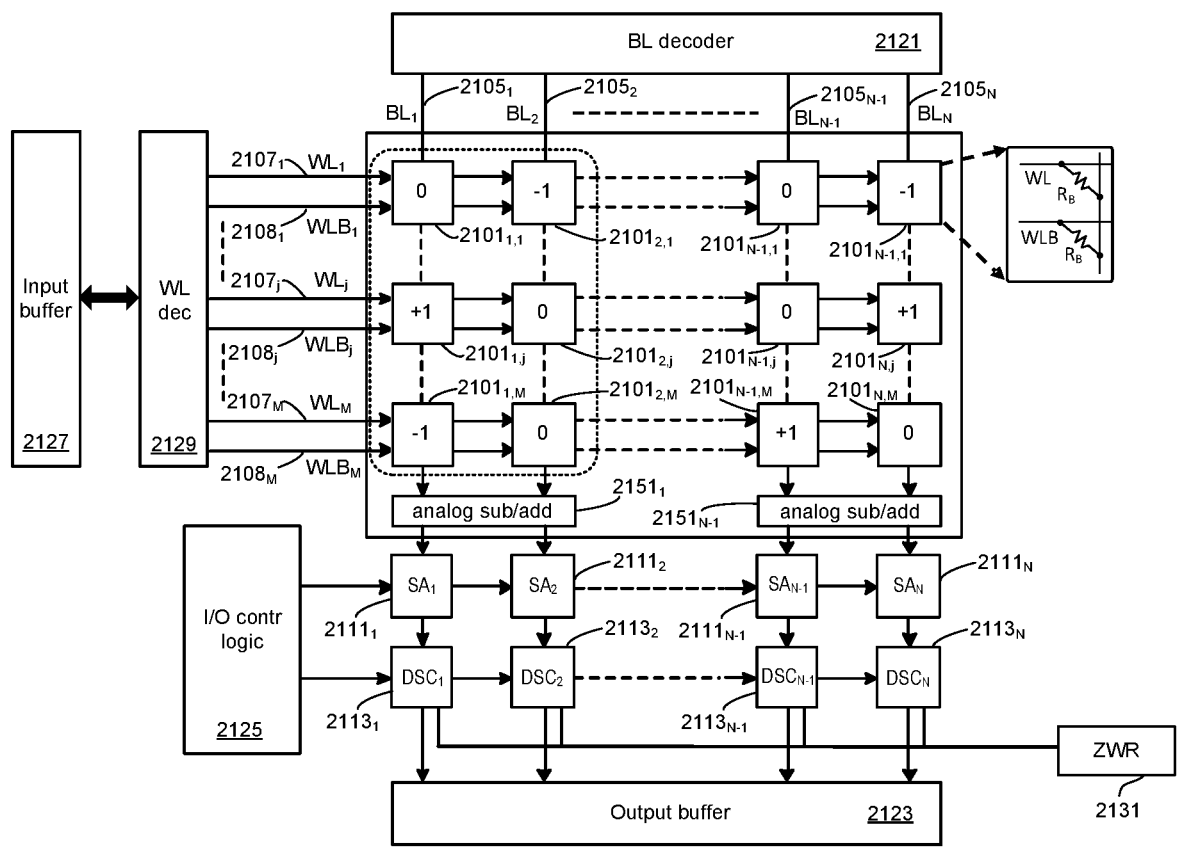
Figure 22:
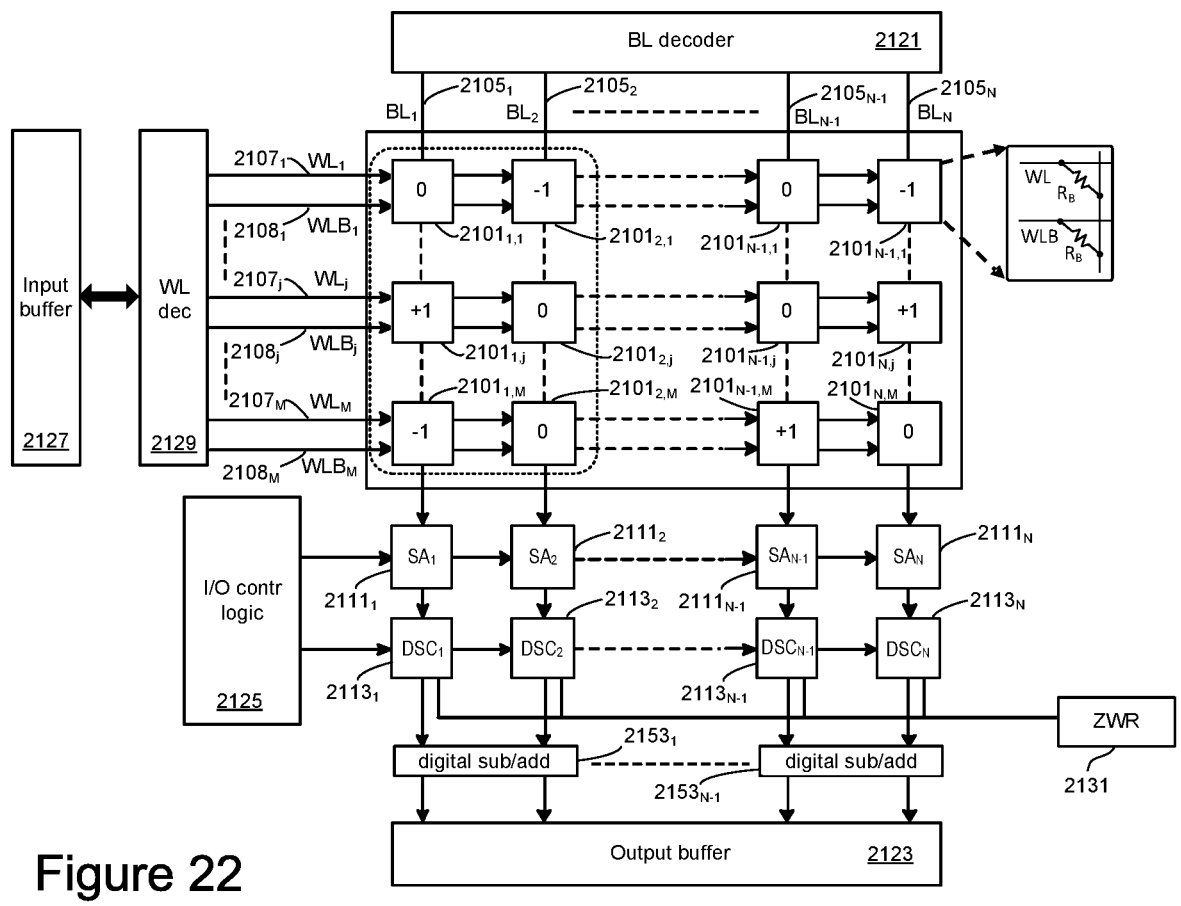

FIGS. 21 and 22 present two architectures of storage class memory blocks for in-memory CNN inference engines with kernel transformations.

Figure 23:
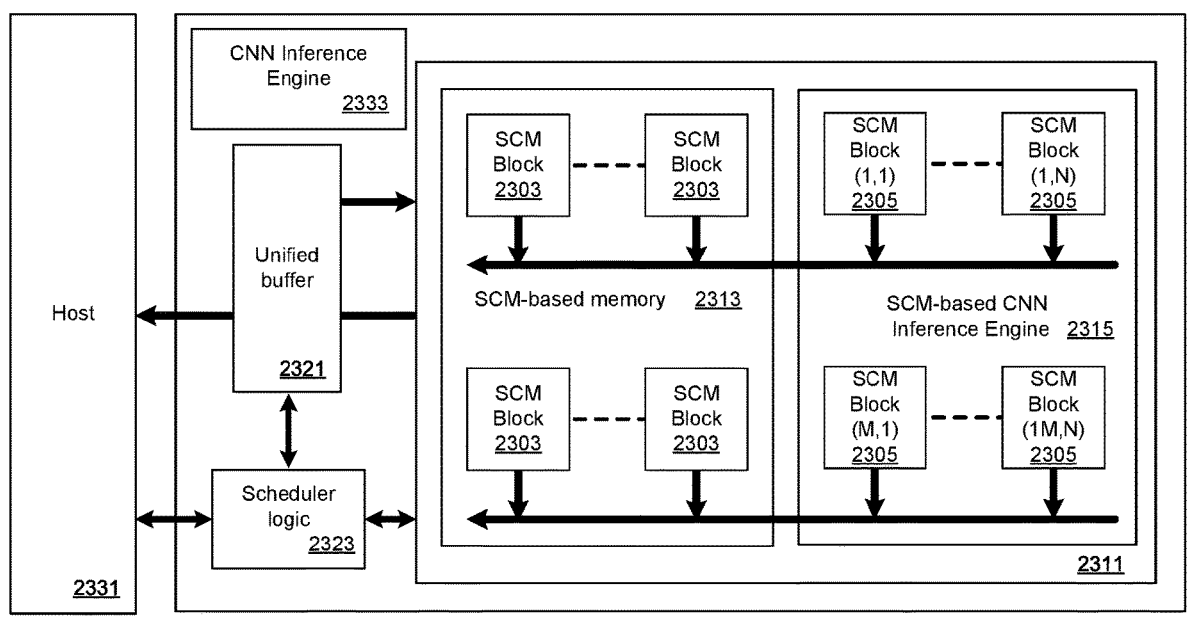

FIG. 23 illustrates a hybrid memory architecture for an embedded CNN inference engine, such as illustrated by the embodiments of FIGS. 21 and 22

Figure 24:
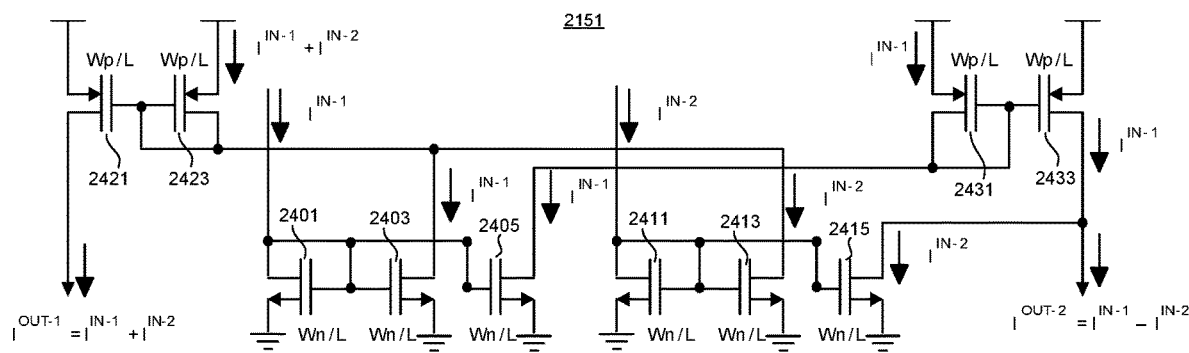

FIG. 24 presents an analog add/subtraction circuit that takes two bit line outputs generates corresponding outputs for the sense amplifier that undoes the kernel transformations.

Figure 25:
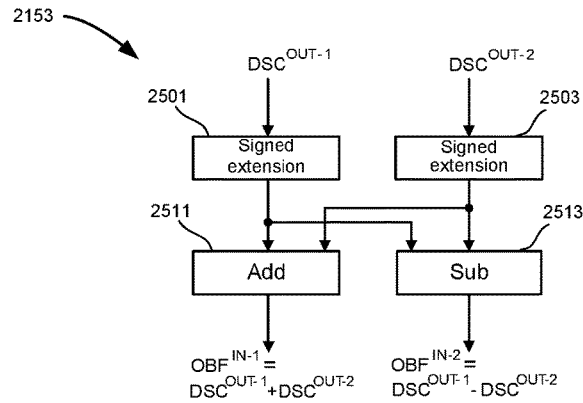

FIG. 25 presents a digital add/subtraction circuit that takes two bit line outputs and generates corresponding outputs for the sense amplifier that undo the kernel transformations.

Figure 26:
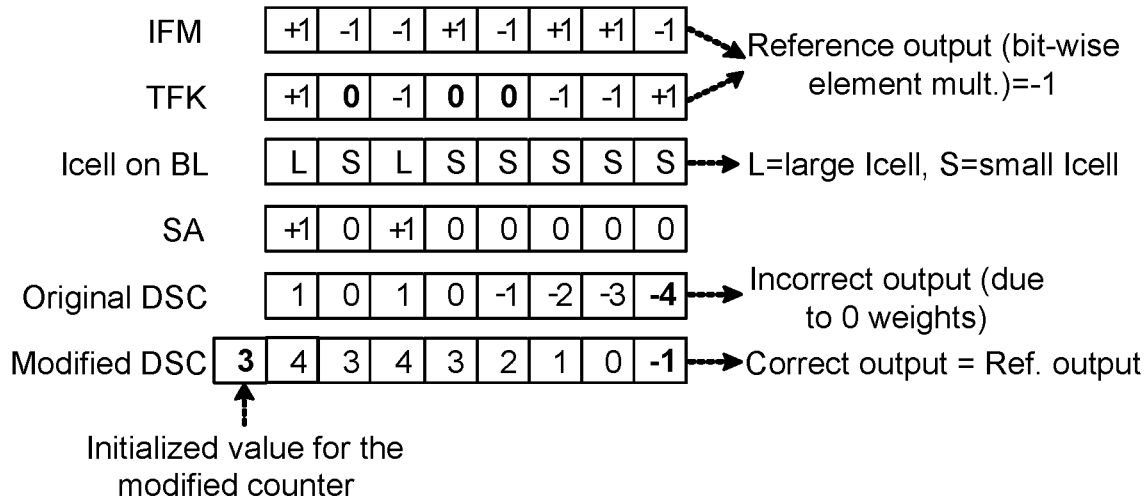

FIG. 26 illustrates the process of obtaining the correct output of bit-wise element multiplication with ternary weights.

Figure 27:
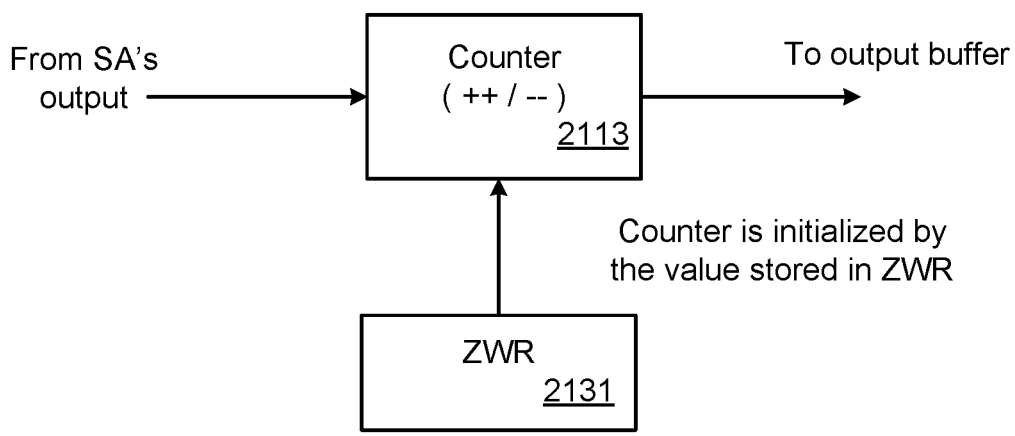

FIG. 27 is a block diagram of a modified digital summation circuit to provide the correct output with ternary weights.

Figure 28:
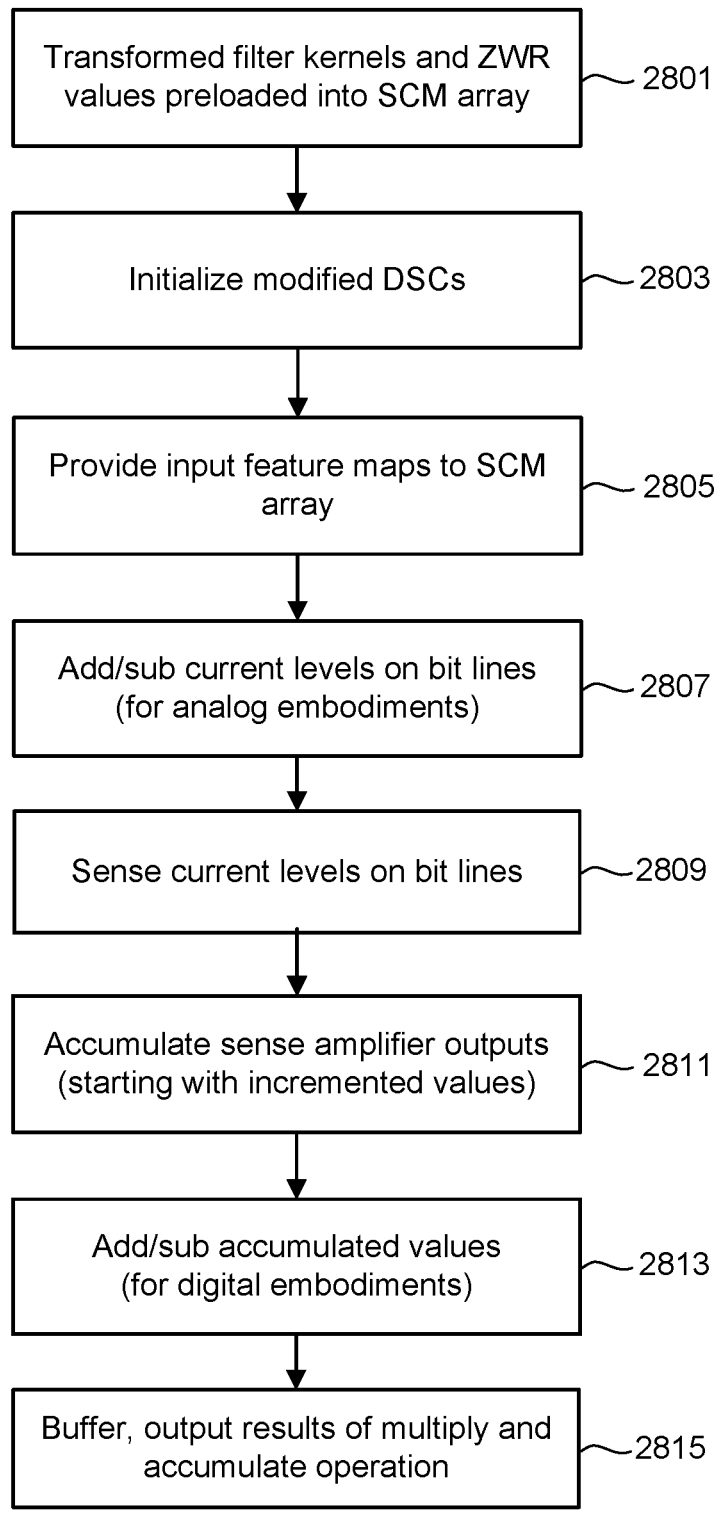

FIG. 28 is a flowchart for an embodiment of an inferencing operation using ternary weight valued filters.

Figure 29:
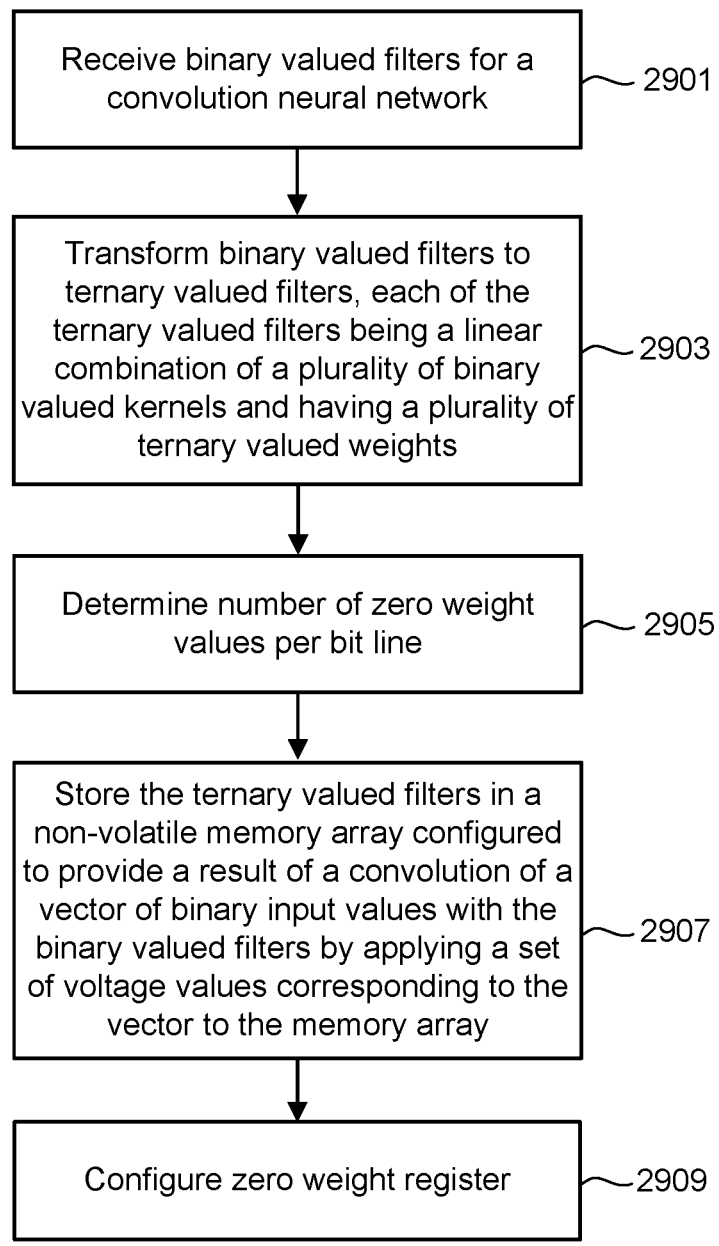

FIG. 29 is a flowchart for an embodiment to determine and store the transformed kernels on a memory die and configure the zero-weight register of the memory die.

Figure 30:
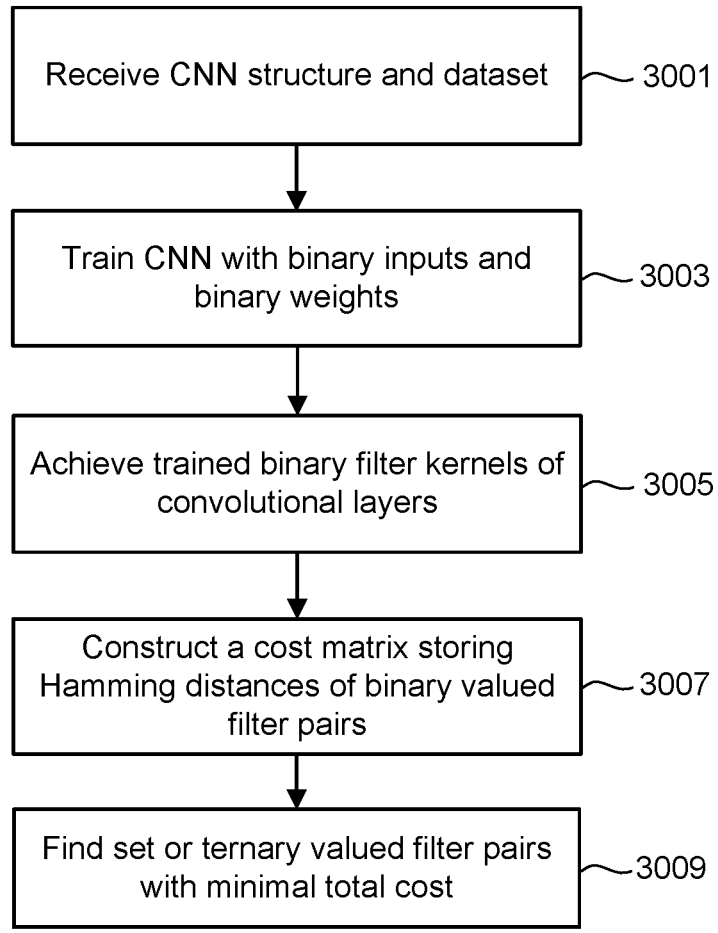

FIG. 30 is a flowchart of one embodiment to generate transformed filter kernels with a maximum number of zero weights.

DETAILED DESCRIPTION

When a convolution neural network (CNN) performs an inference operation, the most time consuming parts of the inference are the convolution operations as these are very computationally intensive matrix multiplication operations using large amounts of data. The convolutions, or matrix multiplications, are performed using sets of weights, referred to as filters, determined during a training process for the CNN. To accelerate the convolution operations and reduce the amount of data that needs to be transferred in order to perform them, the filters can be stored in the memory cells of a non-volatile storage class memory (SCM), such as resistive random access memory (ReRAM or RRAM), magnetic random access memory (MRAM, Spin Transfer Torque MRAM, Spin Orbit Torque MRAM), ferroelectric RAM (FeRAM, F-RAM or FRAM), EEPROM based memory (of NOR, NAND, or other architectures), or a phase change memory (PCM) based array, and the matrix multiplication can be performed as an in-memory operation on the memory chip.

To reduce the amounts of data involved and the complexity of the calculations, a CNN can be implemented through an in-memory multiplication using binary valued inputs and binary valued weights for the filters. The binary valued weights of a filter can be stored as pairs of memory cells along a bit line in a memory array, where the input values are applied to the word line pairs connected to corresponding memory cell pairs. In a binary input, binary weight implementation, when the weight value and input value match (i.e., (−1, −1) or (+1, +1)), a high memory cell current level will result on the corresponding bit line; and when the weight value and input value do not match (i.e., (−1, +1) or (+1, −1)), a low memory cell current level will result on the corresponding bit line. As half of these input-weight combinations result in a high current level on the bit line, the large number of computations involved in a convolution operation can result in a significant power consumption.

To reduce the power consumption of the in-memory convolution operation, the binary valued filters are transformed into ternary valued filters. By taking pair-wise sums and differences of binary valued filters, ternary valued filters are formed in which the weights are valued (−1, 0, +1). The zero valued weights can be stored as a pair of memory cells on a common bit by setting both of the pair of memory cells to a high resistance state. As this results in a low cell current for either of the binary input values, power consumption is reduced.

To account for the zero valued weights, a zero weight register on the memory die can hold a value for the number of zero weights along each of the bit lines. When accumulating the results of an in-memory multiplication, the zero weight value for each of the bit lines can be used to initialize the accumulated count along each bit line to accurately compensate for the zero weights.

As the in-memory multiplication is performed using the transformed ternary valued filters, the results of the multiplication need to be transformed to undo the filter transformation. By storing a transformed filter pair on a pair of bit lines and taking the sum and difference of the resultant multiplication results for the bit line pair, the filter transformation can be reversed and the correct convolutional result for the binary inputs and original binary filters can be obtained.

Figure 1:
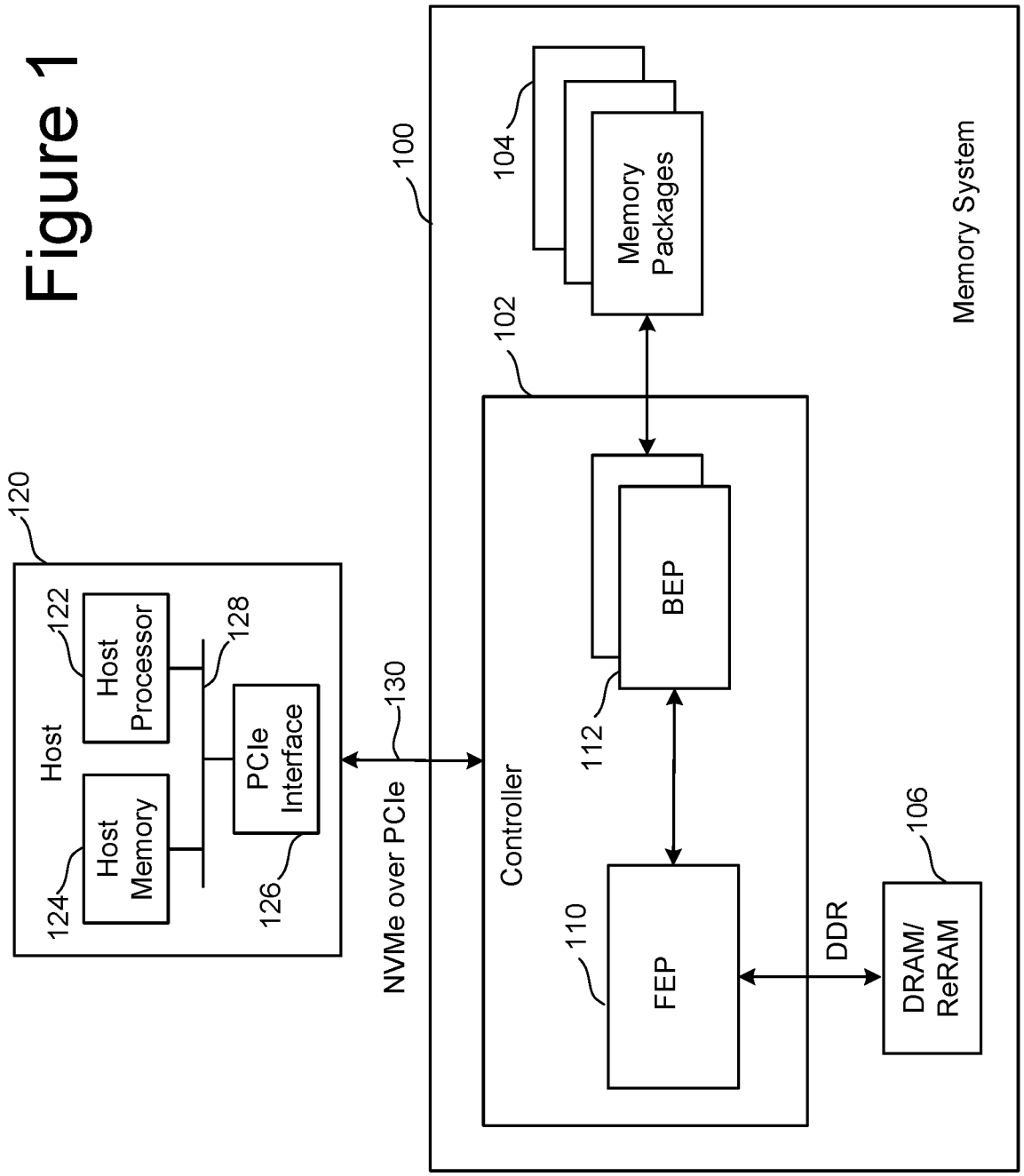
FIG. 1 is a block diagram of one embodiment of a memory system connected to a host.

FIG. 1 is a block diagram of one embodiment of a memory system 100 connected to a host 120. Memory system 100 can implement the technology proposed herein, where the neural network inputs or other data are received from the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM).

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
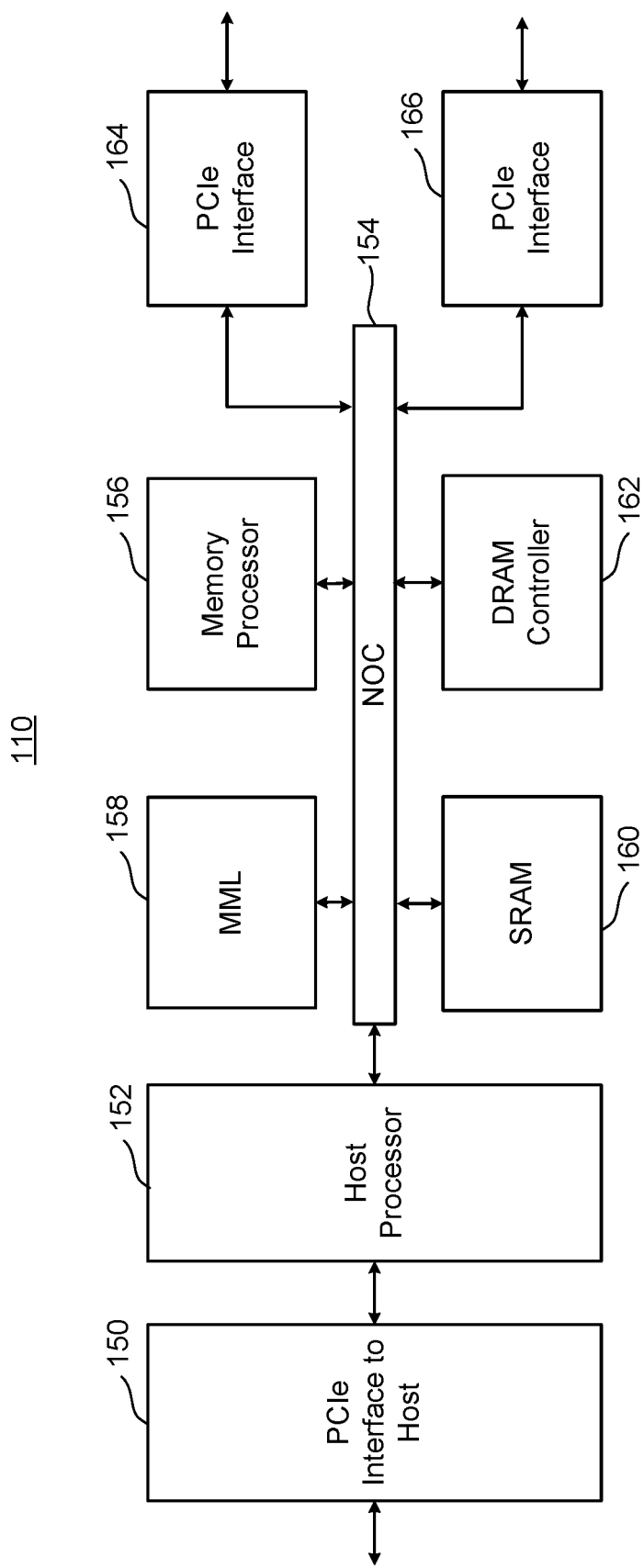
FIG. 2 is a block diagram of one embodiment of a Front End Processor Circuit.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 126 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, a power control circuit 316, and a zero-weight register ZWR 320. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

The zero-weight register ZWR 320 can be part of a general set of registers or a set of purpose specific registers that can be used for maintaining information of on the number of zero valued weights stored along each the bit lines. The use of this register will be discussed further with respect to the inference process in convolutional neural networks with ternary valued filters.

For purposes of this document, the phrase "one or more control circuits" can refer to a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories (resistive random access memories), magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Turning now to types of data that can be stored on non-volatile memory devices, a particular example of the type of data of interest in the following discussion is the weights used is in convolutional neural networks, or CNNs. The name "convolutional neural network" indicates that the network employs a mathematical operation called convolution, that is a specialized kind of linear operation. Convolutional networks are neural networks that use convolution in place of general matrix multiplication in at least one of their layers. A CNN is formed of an input and an output layer, with a number of intermediate hidden layers. The hidden layers of a CNN are typically a series of convolutional layers that "convolve" with a multiplication or other dot product. Though the layers are commonly referred to as convolutions, technically these are often a sliding dot product or cross-correlation, such as discussed below with respect to FIG. 8.

Each neuron in a neural network computes an output value by applying a specific function to the input values coming from the receptive field in the previous layer. The function that is applied to the input values is determined by a vector of weights and a bias. Learning, in a neural network, progresses by making iterative adjustments to these biases and weights. The vector of weights and the bias are called filters and represent particular features of the input (e.g., a particular shape). A distinguishing feature of CNNs is that many neurons can share the same filter.

FIG. 6 is a schematic representation of an example of a CNN. Starting from an input image of an array of pixel values, followed by a number convolutional layers, that are in turn followed by a number of fully connected layers, the last of which provides the output. Each neuron in the first convolutional layer takes as input data from an n×n pixel sub-region of the input image. The neuron's learned weights, which are collectively referred to as its convolution filter, determine the neuron's single-valued output response to the input. In the convolution, a neuron's filter is applied to the input image by sliding the input region along the image's x and y dimensions to generate the values of the convolutional layer. In practice, the equivalent convolution is normally implemented by statically identical copies of the neuron to different input regions. The process is repeated through the convolutional layer using each layer's learned weights, after which it is propagated through fully connected layers using their learned weights.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

FIG. 7A is a flowchart describing one embodiment of a process for training a neural network to generate a set of weights. The training process is often performed in the cloud, allowing additional or more powerful processing the accessed. At step 701, the input, such as a set of images, is received (e.g., the image input in FIG. 6). At step 703 the input is propagated through the layers connecting the input to the next layer (e.g., CON1 in FIG. 6) using the current filter, or set of weights. The neural network's output is then received at next layer (e.g., CON2 in in FIG. 6) in step 705, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 705. A user can then review the results at step 707 to select which probabilities the neural network should return and decide whether the current set of weights supply a sufficiently accurate labelling and, if so, the training is complete (step 711). If the result is not sufficiently accurate, the neural network adjusts the weights at step 709 based on the probabilities the user selected, followed by looping back to step 703 to run the input data again with the adjusted weights. Once the neural network's set of weights have been determined, they can be used to "inference," which is the process of using the determined weights to generate an output result from data input into the neural network. Once the weights are determined at step 711, they can then be stored in non-volatile memory for later use, where the storage of these weights in non-volatile memory is discussed in further detail below.

FIG. 7B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. At step 721, the input is received, such as the image of a dog in the example used above. If the previously determined weights are not present in the device running the neural network application, they are loaded at step 722. For example, on a host processor executing the neural network, the weight could be read out of an SSD in which they are stored and loaded into RAM on the host device. At step 723, the input data is then propagated through the neural network's layers. Step 723 will be similar to step 703 of FIG. 7B, but now using the weights established at the end of the training process at step 711. After propagating the input through the intermediate layers, the output is then provided at step 725.

FIG. 8 is a schematic representation of a convolution operation between an input image and filter, or set of weights. In this example, the input image is a 6×6 array of pixel values and the filter is a 3×3 array of weights. The convolution operation is performed by a matrix multiplication the 3×3 filter with 3×3 blocks of the input image. For example, the multiplication of the upper-left most 3×3 block of the image with the filter results in the top left value of the output matrix. The filter can then be slid across by one pixel on the image to generate the next entry of the output, and so on to generate a top row of 4 elements for the output. By repeating this by sliding the filter down a pixel at a time, the 4×4 output matrix is generated. Similar operations are performed for each of the layers. In a real CNN, the size of the data sets and the number of convolutions performed mean that extremely large numbers of such operations are performed involving very large amounts of data.

CNN inference is heavily based on the Matrix Multiplication (MM) of the activation, or input value, and the weight. In a common implementation of a CNN, both the input values and the weight values of a filter can be multi-bit data values, as illustrated in the example of FIG. 8. A binary input, binary weight implementation of a CNN can often provide quite accurate results, while reducing the amounts of data involved and simplifying the matrix multiplication of a convolution operation. Such binary value CNNs will be discussed in more detail further below, but the storage of CNN filters in storage class memory and its use for in-memory inferencing will be discussed in the more general case first.

FIGS. 9 and 10 illustrate the use of storage class memory for implementing in-array matrix multiplication. In FIG. 9, the memory structure 901 is a portion of a storage class memory, such as ReRAM, PCM or other resistive non-volatile memory, that can correspond to a 4×4 section of the memory structure 326 of FIG. 1. A resistive memory cell $R_{i,j}$ $903_{i,j}$ is connected between word line $WL_i$ and bit line $BL_j$. The inputs are applied as voltage levels to the word lines and the individual weights are stored as a resistance level on a resistor, so that when a voltage is applied to a word line a current will flow through a resistor to the bit lines, where the current can be sensed. In FIG. 9, the sensing circuitry is represented by the sample and hold circuit $S\&H_j$ $905_j$ along bit line $BL_j$. For example, the sample and hold circuits can use current based sensing to provide an analog output, and are in turn connected to an analog to digital converter ADC 907. A shift and add circuit 909 is used to perform accumulation operations from the values received from the ADC 907. Depending on the embodiment, the input and weight values can be binary or multi-state.

FIG. 10 illustrates the multiplication mechanism for the two circled memory cells, $R_{1,4}$ $903_{1,4}$ and $R_{2,4}$ $903_{2,4}$, of FIG. 9 in a vector-matrix multiplication. In the example of FIG. 10, memory cell $R_{1,4}$ $903_{1,4}$ is programmed to have a conductance (i.e., inverse resistance) of $G_{1,4}$ and memory cell $R_{2,4}$ $903_{2,4}$, is programmed to have a conductance of $G_{2,4}$. If a vector of input values, or "input vector", of voltages $(V_1, V_2)$ is applied to the word lines $WL_1$ and $WL_2$, the resultant current through the two memory cells will be $I_{1,4}=V_1 G_{1,4}$ and $I_{2,3}=V_2 G_{2,4}$ according to Ohm's law. The combined current on $BL_4$ is then $I_4=I_{1,4}+I_{2,3}=V_1 G_{1,4}+V_2 G_{2,4}$. Consequently, by applying a vector of input values of voltages on the word lines and accumulating the results from the bit lines, the output of the shift and add circuit 909 the result of an input vector-weight matrix (or filter) multiplication. An input, or activation, matrix can be applied a column at a time, with the results accumulated, to provide the matrix multiplications to obtain the output matrix. This SCM-based in-array technique can accelerate matrix multiplication and be performed in a column-oriented mode, in which (one or several group of) word lines are activated in parallel and bit lines are sequentially accessed to read out data, or in a row-oriented mode, in which (one or several groups of) bit lines are activated in parallel and word lines are sequentially charged to read out data FIG. 9 represents the memory structure 326, of which the portion 901 forms a portion, as a two dimensional array. The embodiments described below of architectures for the leveraging of all-zero rows or columns will also be represented in a planar, two dimensional figure; however, the embodiments presented below can also be implemented in three dimensional array structures, such as illustrated in FIGS. 11 and 12.

FIG. 11 depicts one embodiment of a portion of a monolithic three-dimensional memory array 326 that forms a differential cross-point (DX) architecture that includes a second memory level 1120 positioned above a first memory level 1118. Memory array 326 is one example of an implementation for memory array 326 in FIG. 5. The bit lines $BL_1$-$BL_5$ are arranged in a first direction (represented as running into the page) and the word lines $WL_{0,1}$-$WL_{0,4}$ and $WL_{1,1}$-$WLB_{1,4}$ are arranged in a second direction perpendicular to the first direction. FIG. 11 is an example of a horizontal cross-point structure in which word lines $WL_{0,1}$-$WL_{0,4}$ and $WL_{1,1}$-$WLB_{1,4}$ and $BL_1$-$BL_5$ both run in a horizontal direction relative to the substrate, while the memory cells 1100 are oriented so that the current runs in the vertical direction. As depicted, the upper conductors of first memory level 1118 may be used as the lower conductors of the second memory level 1120 that is positioned above the first memory level. In a memory array with additional layers of memory cells, there would be corresponding additional layers of bit lines and word lines.

As depicted in FIG. 11, memory array 326 includes a plurality of memory cells 1100. The memory cells 1100 may include re-writeable memory cells, such as can be implemented using ReRAM, MRAM, PCM, or other material with a programmable resistance. With respect to first memory level 1118, a first portion of memory cells 1100 are between and connect to bit lines $BL_1$-$BL_5$ and word lines $WL_{0,1}$-$WL_{0,4}$. With respect to second memory level 1120, a second portion of memory cells 1100 are between and connect to bit lines $BL_1$-$BL_5$ and word lines $WL_{1,1}$-$WLB_{1,4}$. The current in the memory cells of the first memory level 1118 may flow upward as indicated by arrow $A_1$, while the current flowing in memory cells of the second memory level 1120 may flow downward as indicated by arrow $A_2$.

FIG. 12 depicts one embodiment of a portion of a monolithic three-dimensional memory array 326 that includes a first memory level 1212 positioned below a second memory level 1210. The architecture of FIG. 12 provides another example of an embodiment that can be used for the storage of neural network weights, in this case using an extended three dimensional structure. The memory array of FIG. 12 is one example of an implementation for memory array 326 in FIG. 5. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell Min is disposed between local bit line $LBL_{11}$ and word line $WL_{10}$). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory material, a ReRAM material, an MRAM material, or a PCM material. The global bit lines $GBL_1$-$GBL_3$ are arranged in a third direction that is perpendicular to both the first direction and the second direction. A set of bit line select devices (e.g., $Q_{11}$-$Q_{31}$), such as a vertical thin film transistor (VTFT), may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

A technique that can be used to reduce the computational complexity of the convolution process and reduce the amount of data involved is by use of binary inputs and binary weight values for the filters. In a binary CNN, the multiplications between the input values and weight values computes a convolution multiplication with "binary" inputs $\{-1, 1\}$ and "binary" weights $\{-1, 1\}$. FIG. 13 is a table illustrating the output of a binary neural network in response to the different input-weight combinations. As shown in the right-most column, when the input and weight match, the output is 1; and when the input and the weight differ, the output is −1.

When storing a binary weight in a binary memory cell format, if the −1 and +1 weight are respectively stored as unprogrammed and programmed memory cells, an unprogrammed weight (−1) will have a low output for either a low read level (such as ground) or a high read level. Because of this, only the +1 weight entries in the table of FIG. 13 will read correctly. To generate the correct response for the −1 weight levels requires that these be stored separately and in a complementary manner as the negative weights. In previous approaches to store binary weights, the weights and negative weights have been stored in either separate arrays or along different bit lines of an array. This requires two separate read operations, one for −1 weights and one for +1 weights, where the two read results are combined to determine the full result corresponding to the table of FIG. 13. To improve upon this situation, FIGS. 14-16D illustrate an embodiment for the realization of a CNN with binary-inputs and binary-weights in a non-volatile memory array storing weights in a differential memory cell structure using a pair of memory cells to store the weight, allowing either weight value to be read in a single read operation.

FIG. 14 represents an embodiment where a memory cell pair is used for storing a binary weight W of filter for a convolutional neural network. The memory cell pair of FIG. 14 can be the same as illustrated in FIG. 10, but labelled to illustrate their use for the storage of a binary weight value. In the shown embodiment, the two memory cells, $R_A$ and $R_B$, are resistive memory cells, such as ReRAM, MRAM, or PCM based memory cells of a storage class memory array, with complementary resistance levels are each connected between a corresponding word line WL, WLB and a shared bit line. The input IN is applied to the word line pair, or differential word line, of WL, WLB. The output O is then the product of the input IN and the weight W corresponding to the level on the bit line BL.

FIG. 15 illustrates the encoding of the input values, weight values, and output values as word line voltages, resistance values, and bit line voltages, respectively, for use as an in-memory CNN inference engine. For the input values IN, a +1 input corresponds to a high voltage level V (a few volts or a few tenths of a volt, for example) applied to WL and a low voltage level (such as ground, or 0) applied to WLB. An input of IN=−1 corresponds to a low voltage level 0 applied to WL and a high voltage level V applied to WLB. Consequently, as shown in the first three columns of FIG. 15, a +1 neuron is presented as (V, 0) on (WL, WLB) and −1 neuron as (0,V).

For the weight values W, a +1 weight corresponds to a low resistance state (LRS) for $R_A$ and a high resistance state (HRS) for $R_B$. A weight value of W=+1 corresponds to a high resistance state (HRS) for $R_A$ and a low resistance state (LRS) for $R_B$, as represented in the $4^{th}$, $5^{th}$ and $6^{th}$ columns of FIG. 15. When an input voltage pattern is applied to the word line pair (WL, WLB), the memory cell pair acts as a voltage divider, whose output is the voltage $V_O$ on the bit line BL with an output value of O=IN*W, as can be illustrated with respect to FIGS. 16A-16D.

Figure 16B:
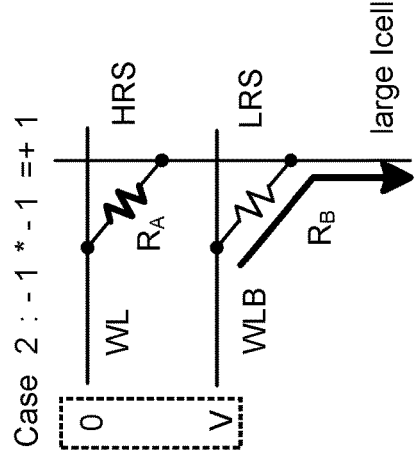
Figure 16D:
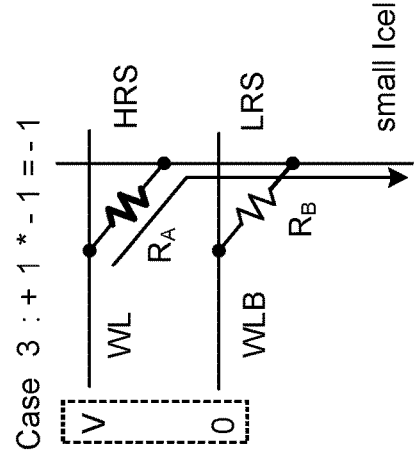
Figure 16A:
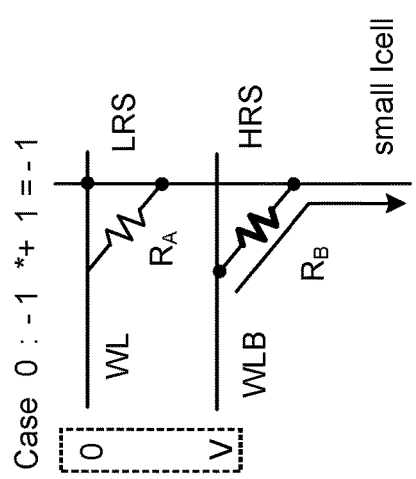
Figure 16C:
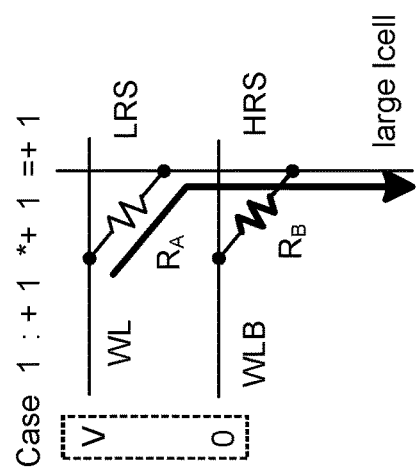

FIGS. 16A-16D respectively correspond to the four cases illustrated in the four lines FIG. 15. In FIG. 16A, an input of IN=−1, corresponding to (WL, WLB)=(0, V), is applied to a weight of W=+1, corresponding to $(R_A, R_B)$=(LRS, HRS). The resultant voltage on the bit line is then:

$$V_O = V_{BL} = V(R_L/(R_L+R_H)) = V_L,$$

where $V_L$ corresponds to an output of O=−1. In FIG. 16B, an input of IN=+1, corresponding to (WL, WLB)=(V, 0), is applied to a weight of W=+1, with the resultant voltage on the bit line of:

$$V_O = V_{BL} = V(R_H/(R_L+R_H)) = V_H,$$

where $V_H$ corresponds to an output of O=+1. FIGS. 16C and 16D similarly represent the respective IN=−1 and IN=+1 for the W=−1 cases, with respective outputs on the bit line BL of $V_O=V_H$ (O=+1) and $V_O=V_L$ (O=−1).

As illustrated by FIGS. 16A-16D, the differential pair of memory cells with complementary resistive values form a voltage divider such that the bit line BL voltage corresponds to the output values (+1, −1). The differential representation of word line voltage patterns and resistance states match the truth table of FIG. 13 to generate O=IN*W in a single in-array sensing operation.

As illustrated by FIGS. 15 and 16A-16D, when the binary input value matches the binary weight value, one of the two memory cells in the pair storing the weight will conduct at the higher current level of the +1 output level. As this occurs for half of the input-weight combinations, for a random set of input and weight values half of the multiplications of a convolution operation will draw the high current level. As a typical convolution operation will involve a very large number of such multiplication, the amount of current consumed in a convolution operation by an in-memory CNN inference engine can be significant. In a typical implementation using ReRAM, for example, the large Icell value (where the high input voltage is applied to an low resistance state memory cell) can be on the order of 1000 times that of the small Icell value (when the high input voltage is applied to a high resistance memory cell). If it were possible to increase the number of input-weight multiplications in the convolutional process that resulted in in a small Icell result, while maintaining the accuracy of the binary-input, binary weight CNN, the current consumption of the convolution process could be significantly reduced.

To this end, the following presents techniques for kernel transformation, converting the entries of binary-valued filters for a CNN into ternary valued filters, having weight values of −1, 0, and +1. Each weight can still be stored in a memory cell pair of a memory array, but the 0 weight value can be encoded so that the memory cell pair will have a low Icell value independent of the binary input. This can result in a significant decrease in the amount of current, and consequently power, consumed by an in-memory CNN inference process. Although the following techniques can also be applied to the case where a memory filter is ternary valued to begin with, as for the filter example from FIG. 8, the following discussion will mainly focus on the case of binary value filters that are transformed to ternary valued filters.

More specifically, the following presents techniques for reducing the power consumption of storage class memory array based computing cores that are main components of embodiments for in-memory CNN inference engines with binary inputs and binary weights. Kernel transformation techniques can be used to convert the binary weights (−1, +1) of original filter kernels into ternary form (−1, 0, +1) for convolutional layers. By doing so, the common-shared weights between original filter kernels can be "algorithmically forced" to zeros which helps to save the array power without degrading any inference accuracy. An efficient encoding scheme can be used to map zero weights introduced by kernel transformation technique into an SCM array based computing core by using only high resistance state SCM cells. Therefore, the number of low resistance state cells required for mapping convolutional layers is substantially decreased, resulting in significant power reduction for SCM array based computing cores. An architecture for SCM array based CNN inference engine using kernel transformation is presented, which can use simple structures for analog and digital add/subtraction circuits to generate the correct output.

In the present discussion, the term the "binary valued inputs" is used interchangeable with "binary valued activations", which refer to the inputs of hidden layers. These should not be confused with the test data that is provided to the first layer where, in a binary neural network, the input (test data) of first layer are typically not binarized to avoid a large accuracy drop.

FIGS. 17 and 18 illustrate an example of a kernel transformation for convolutional computation using binary input (−1, +1) and binary weights (−1, +1) for the filter. The kernel transformation technique transforms original filter kernels with binary (−1,+1) weights into transformed filter kernels with ternary weights (−1, 0, +1). The zero weights introduced by the kernel transformation have no impact on the inference accuracy. In this way, it fundamentally differs from zero weights achieved by weight pruning techniques (such as done to increase sparsity) which generally require re-training of a model to recover lost accuracy. The use of transformed filter kernels for convolutional compute has the advantages, relative to the original filter kernels, of reducing the number of multiply and accumulate (MAC) operations by eliminating the multiplications with zero input weights. There is no performance loss or memory overhead for the transformation, and the add/subtraction circuit is relatively simple.

FIG. 17 illustrates an example of a typical convolutions between a binary valued feature map FM 1701 and a pair of binary valued filter kernels FK1 1703 and FK2 1705 for an example where FM 1701, FK1 1703, and FK2 1705 are 3×3. The element-wise matrix multiplication (represented as (.) in FIG. 17) is performed between FM 1701 and each of FK1 1703 and FK2 1705. For FK1 1703, as each of its weights are the same as the corresponding value in FM 1701, each element-wise multiplication gives 1 and the multiply and accumulation operation gives an output of 9. For FK2 1705, the multiply and accumulation operation gives an output of 3.

Between the two multiply and accumulate operations illustrated in the example of FIG. 17, there are a total of 9+9=18 multiply and accumulation operations. As illustrated by the bolded entries, FK1 1703 and FK2 1705 share a number of common entries. The non-bolded entries of FK1 1703 and FK2 1705 have opposite values. By taking linear combinations of these two original filter kernels FK1 1703 and FK2 1705, two transformed kernels can be generated with zero weight entries that will have low Icell values when either of a −1 or a +1 input is applied.

For example, FIG. 18 uses a transformed kernel FK1' 1803 of FK1'=(FK1+FK2)/2 and a transformed kernel FK2' 1805 of FK2'=(FK1−FK2)/2. These transformed filter kernels are combinations of the sum and difference of the two original kernels and will have all of the information of the two original kernels. For the entries that differed, the element-wise sum of original kernels will generate 0s in FK1' 1803; and for the entries that are the same, the element-wise difference of original kernels will generate 0s in FK2' 1805. As illustrated, for the element-wise matrix multiplication of the input FM 1801 with FK1' 1803 and FK2' 1805 now only has nine non-zero multiple and accumulate operations, rather 18. Because of the transformations, however, the element-wise matrix multiplication of FM 1801 with FK1' 1803 and FK2' 1805 will differ the results with the original filter kernels, now respectively yielding 6 and 3. However, the original kernels' outputs can be restored by inverting the transformation. By use of add/subtraction circuit 1807, the output of FM1 can be restored by taking the sum of the outputs of FK1' 1803 and FK2' 1805; and the output of FM2 can be restored by taking the of the outputs of FK1' 1803 minus FK2' 1805.

FIG. 19 presents a table illustrating an embodiment for the mapping of ternary weight values of the transformed filter kernels into storage class memory cells. FIG. 20 illustrates how the different cases of FIG. 19 are implemented on memory cell pairs along a shared bit line. FIGS. 19 and 20 extend the binary weight value implementation of FIGS. 15 and 16A-16D to include weight values of 0, as well as −1 and +1.

FIG. 19 presents six cases, corresponding the six combinations of the binary input (−1,+1) and the ternary weight values (−1,0,+1). The input column shows alternating input logic values of −1 with the (0, V) voltage pattern, corresponding to word line WL of a word line pair at 0V (or, more generally, a low input voltage) and WLB of a word line pair at the high input voltage V, and input logic +1 with the (V, 0) voltage pattern, with the V on word line WL and 0V on word line WLB. The logic values for the weights stored in a word line pair, or "synapse", column illustrates the encoding of a logic value +1, where resistive memory cell $R_A$ is in a low resistance state (LRS) and resistive memory cell $R_B$ is in a high resistance state (HRS); a logic value −1, where resistive memory cell $R_B$ is in a low resistance state (LRS) and resistive memory cell $R_A$ is in a high resistance state (HRS); and also introduces a logic value of 0, where both of resistive memory cells $R_A$ and $R_B$ are in high resistance state.

The output columns for the −1 and +1 weight values are −1 if the input and weight do not match, corresponding to a low voltage level ($V^{LOW}$) and small cell current Icell; and are +1 if the input and weight do match, corresponding to a high voltage level ($V^{HIGH}$) and large cell current Icell.

For the 0 weight values, both of the memory cells of the pair are in a high resistance state. Consequently, for either input value the output will have $V_{LOW}$ on the bit line and a small Icell value. Consequently, the cases 4 and 5 respectively provide the same output as cases 0 and 3, corresponding to an output logic of −1, in response to the −1 input and +1 input. The output for the 0 weight should be a logic 0 output for either input. The case 0/3 can be distinguished from the case 4/5 by use of a zero weight register (ZWR), as described below.

FIG. 20 illustrates the encoding of the ternary weight values into a memory cell pair and their response to the binary input values. For case 0, the −1 input applies the (0, V) voltage pattern of a low voltage (0V) along WL to the low resistance state memory cell $R_A$ and the high voltage V along WLB to high resistance state memory cell $R_B$, so that the resultant current is the small Icell. For case 1, the inputs on WL and WLB are switched relative to case zero and use the (V, 0) voltage pattern so that V is now on the low resistance state memory cell $R_A$, resulting in a large Icell. Cases 2 and 3 respectively have the same input as cases 0 and 1, but as they store a +1 weight value the resistance states of $R_A$ and $R_B$ are reversed, so that case 2 now has a large Icell and case 3 has the small Icell. Cases 4 and 5 store a 0 weight by having both memory cells in the high resistance state, so that for either input the small Icell results.

The encoding scheme described with respect to FIGS. 19 and 20 allow for a memory cell pair, or synapse, to accommodate the 0 weights existing in transformed filter kernels, with cases 4 and 5 extending a conventional binary neural network scheme in order to support zero weights. The mapping of the ternary weight values of −1, 0, and +1 into a pair of storage class memory cells can decrease the probability of the large Icell level existing on bit lines, compared with the conventional binary weight (−1,+1). As the number of low resistance cells is decreased, the power consumption of the array based computing core is reduced. This approach can also be extended and applied to multi-bit storage class memory cells in order to reduce the number of memory cells required to encode a single synapse.

To illustrate the saving in current consumption the that can be saved through use of kernel transformation, the example of FIGS. 17 and 18 can be used. In multiplications of FIG. 17, the total number of low resistance cells is 18, as this is equal to the number of multiply and accumulate operations. For FK1, there will be 9 large Icell values and for FK2 6 large Icell values and 3 small Icell values. For a ReRAM cell, the small Icell value is on the order 0.005 uA and the large Icell value is on the order of 5 uA, so that the total bit line current for the example of FIG. 17 would be around 75 uA. For the transformed kernel of FIG. 18, there are 9 low resistance state cells. FK1' will have 3 small Icell values and 6 large Icell values; and FK2' will have 6 small Icell values and 3 large Icell values, so that the total bit line current for FIG. 18 will be around 45 uA, or less than 2/3 of that for FIG. 17.

FIGS. 21 and 22 present two architectures of storage class memory blocks for in-memory CNN inference engines with kernel transformations. The storage class memory of FIGS. 21 and 22 support convolutional layers using kernel transformation by mapping the ternary weight values (−1,0,+1) weight for a single synapse $2101_{i,j}$ of transformed filter kernels to a pair of storage class cells connected along a common bit line BL 2105 as described above in FIGS. 19 and 20. In FIGS. 21 and 22, i (the number of bit lines) runs from 1 to N and j (the number of word line pairs) runs from 1 to M.

In the FIGS. 21 and 22, an example set of weight values are shown for the synapses. The weights of a pair of transformed filter kernels are stored are a corresponding set of bit lines, such as $BL_1$ 2015$_1$ and $BL_2$ 2015$_2$ in this example as shown in the dashed block, that share a add/sub circuit for inverting the transformation. In FIGS. 21 and 22, the pair of transformed kernels are represented as being on adjacent bit lines, as this can provide an easier layout for the add/sub circuits, but more generally the bit line pairs can be non-adjacent. If the size of the filter kernels are such that the do not fit on a single bit line, they can be placed on multiple bit line pairs.

Focusing on FIG. 21, each memory cell pair 210L$_j$ of a unit synapse is connected along a bit line $BL_i$ 2105$_i$ and word line pair of $WL_j$ 2107$_j$ and of $WLB_1$ 2108$_j$. The bit lines are connected to a bit line decoder 2121 and the word lines are connected to a word line decoder 2129. As the voltage applied to the word line pair of $WL_j$ 2107$_j$ and of $WLB_j$ 2108$_j$ will either just (0,V) or (V,0) in a binary input embodiment, the word line voltages for a pair can be decoded as just for the word line $WL_j$ 2107$_j$ and the voltage for $WLB_j$ 2108$_j$ generated from that of $WL_j$ 2107$_j$ (or the other way around) by an inverter. The input values applied the memory cells pairs are provided to the WL decoder 2129 from an input buffer 2127.

Attached to each bit line $BL_i$ 2105$_i$ is a sense amplifier $SA_i$ 2111$_i$. Sense amplifiers are connected to the bit lines through an analog add/subtract circuit, with each transformed kernel pair providing the inputs of a shared add/subtract circuit to perform the inversion of the kernel transformation as described with respect to FIG. 18 and element 1807. For example, in FIG. 21 bit lines $BL_1$ 2105$_1$ and $BL_2$ 2105$_2$ are both connected to their respective sense amplifiers through analog add/sub 21151. One embodiment for the analog add/subtraction circuit is discussed with respect to FIG. 24.

Each of the sense amplifiers $SA_i$ 2111$_i$ is connected to a corresponding modified digital summation circuit $DSC_i$ 2113$_i$ that performs the accumulation of the multiply and accumulation operation. The digital summation circuit is modified in that it receives information on the number of zero weights stored along the corresponding bit line from a zero weight register (ZWR) 2131, which can be the same as the register ZWR 320 or another register on the memory die, either specifically for this purpose or a general use register put to use for this purpose. The operation of the digital summation circuits and the zero weight register are discussed in more detail below. The sense amplifiers $SA_i$ 2111 and modified digital summation circuits $DSC_i$ 2113$_i$ are connected to I/O control logic 2125 to control their operation. The outputs of the modified digital summation circuits is collected at the output buffer 2123.

The embodiment of FIG. 21 supports sequence access by activating a single word line pair and reading out multiple bit lines in parallel. Since the data is sequentially read out, a simple single-level sense amplifier (i.e., comparator) can be used for optimized implementation. To achieve the final outputs of a convolutional computation, the analog add/subtraction circuits can be adopted to combine the two bit lines' outputs for two transformed filter kernel. Notice that one or several such storage class memory arrays may be required to compute a single convolutional layer depending on its size, both in terms of the size and the number of filter kernels.

FIG. 22 presents another embodiment for a storage class memory block in which a digital add/subtraction circuits are used for reading out bit line values. The embodiment of FIG. 22 repeats the elements of the embodiment of FIG. 21, but rather than have the analog add/sub circuit 2151$_i$ before the sense amplifiers $SA_i$ 2111$_i$ and $SA_{i+1}$ 2111$_{i+1}$ a digital add/subtraction circuit 2153$_i$ is located after the modified digital summation circuits $DSC_i$ 2113$_i$ and $DSC_{i+1}$ 2113$_{i+1}$. The embodiment of FIG. 22 can operate largely as the embodiment of FIG. 21, but with the rectification to undo the kernel transformations digitally from the output of the digital summation circuits 2123$_i$. More detail on the digital add/subtraction circuits 2153$_i$ is given with respect to FIG. 25.

FIG. 23 illustrates a hybrid memory architecture for an embedded CNN inference engine, such as illustrated by the embodiments of FIGS. 21 and 22, that is highly scalable and provides a flexible "heterogeneous" architecture that provides dual functionalities. FIG. 23 includes a memory system 2333 connected to a host 2331. The memory system 2333 in the embodiment of FIG. 23 includes storage class memory based memory section 2311, which includes a conventional memory/storage section 2313 formed of a number storage class memory blocks 2303 for general usage. The storage class memory based memory section 2311 also includes a CNN inference engine section 2315 that can include a number of (N×M in this example) blocks 2305 for use in CNN inferences, where the blocks 2305 can be as described with respect to FIGS. 21 and 22 for in-memory use as a CNN inference accelerator. The memory system 2333 can also include a unified buffer 2321, for both conventional memory/storage section 2313, and CNN inference engine section 2315 and scheduler logic 2323.

FIG. 24 presents an analog add/subtraction circuit that takes two bit line outputs and generates corresponding outputs for the sense amplifier that undoes the kernel transformations, and which can be used for the analog add/subtraction circuits 2151 of FIG. 21. The embodiment of FIG. 24 is based on the use of current mirrors and uses similarly sized transistors for the elements: in this example, each of length L, and width Wn for the NMOS devices and Wp for the PMOS devices. The analog add/subtraction circuit takes as its inputs the outputs two bit lines ($I^{IN-1}$, $I^{IN-2}$) then generate corresponding sum and difference outputs ($I^{OUT-1}$, $I^{OUT-2}$) for the sense amplifiers. $I^{IN-1}$ flows to ground through a diode connected NMOS 2401, which is then mirrored by the NMOSs 2403 and 2405. $I^{IN-2}$ flows to ground through a diode connected NMOS 2411, which is then mirrored by the NMOSs 2413 and 2415.

$I^{OUT-1}$ is supplied from PMOS 2421 which mirrors the current through PMOS 2423. PMOS 2423 is diode connected and drains current to ground though NMOS 2403 and NMOS 2413. As the current through NMOS 2403 and NMOS 2413 are respectively $I^{IN-1}$ and $I^{IN-2}$, the current though PMOS 2423 will be $I^{IN-1}+I^{IN-2}$; and since PMOS 2421 mirrors PMOS 2421, $I^{OUT-1}=I^{IN-1}+I^{IN-2}$.

$I^{OUT-2}$ is supplied from PMOS 2433 which mirrors the current through PMOS 2431. PMOS 2431 is diode connected and drains current to ground though NMOS 2405 so that the current through NMOS 2431, and also the mirroring PMOS 2433, is $I^{IN-1}$. PMOS 2433 supplies $I^{OUT-2}$ and also drains to ground through NMOS 2415, drawing off $I^{IN-2}$, so that $I^{OUT-2}=I^{IN-1}-I^{IN-2}$.

FIG. 25 presents a digital add/subtraction circuit that takes two bit line outputs generates corresponding outputs for the sense amplifier that undoes the kernel transformations, and which can be used for the digital add/subtraction circuits $2153_i$ of FIG. 22. The digital add/subtraction circuit receives the outputs of a pair of digital summation circuits ($DSC^{OUT-1}$, $DSC^{OUT-2}$) as inputs of the signed extension elements 2501 and 2503. The outputs of both signed extension elements 2501 and 2503 are both supplied to each of add block 2511 and subtraction block 2513, which then generate the corresponding outputs $OBF^{IN-1}=DSC^{OUT-1}+DSC^{OUT-2}$ and $OBF^{IN-2}=DSC^{OUT-1}-DSC^{OUT-2}$ for the output buffer.

The add/subtraction circuits $2151_i$ and $2153_i$ are incorporated into the embodiments FIGS. 21 and 22 to invert the kernel transformations so the that the output will correspond to a multiplication and accumulation operation for the original filter kernels before transformation. In the case of the transformed kernels, the 0 weights originated from the transformation of the binary valued weighted original kernels. The techniques described here can also be applied when the filters are ternary valued to begin with, as for the example in in FIG. 6, except in that case there will be no kernel transformation to undo and the add/subtraction circuits $2151_i$ and $2151_i$ would not be used. In either case, though, the presence of the 0 weights need to be accounted for in the final result, as is illustrated with respect to FIGS. 26 and 27.

Referring back to FIGS. 19 and 20, based upon the resultant output current the 0 weight cases 4 and 5 cannot be distinguished from respective cases 0 and 3. Consequently, based just upon the results measured by the sense amplifier connected to a bit line, the result of a multiplication and accumulation operation will be thrown off by any 0 weights stored along the bit line. FIGS. 26-28 illustrate the use of a zero weight register and a modified digital summation circuit to compensate for the presence of 0 weights.

FIG. 26 illustrates the process of obtaining the correct output of bit-wise element multiplication with ternary (−1, 0, +1) weights using example values for both the input and the transformed filter kernel. The first row in FIG. 26 corresponds to a binary valued input feature map (IFM), in this example of a 3×3 matrix that has been mapped onto a 9 element vector for performing a convolution. The second row of FIG. 26 corresponds to a ternary valued transformed filter kernel (TFK), which has also been mapped onto a 9 element vector for performing a convolution. To perform the convolution operation, a bit-wise multiplication of the IFM and TFK is performed by sequentially applying the input values from IFM along a word line pair to the weight values. The results are added up and, as shown at right, this should provide the result should be −1. Note that the transformed filter kernel of this example has three 0 weight values.

The third line of FIG. 26 illustrates the result of bit-wise multiplication of the example IFM and TFK values when implemented as an in-memory process, where the weights of the transformed kernel are stored in memory cell pairs along a bit line and the input feature map is applied to the word line pairs of the memory array. The result of each bit-wise multiplication is the a current on the bit line, either a large Icell (L) or a small Icell (S). The fourth line shows the sense amplifier (SA) outputs, where a large Icell corresponds to a 1 and a small Icell to a 0. In the embodiments described here, the sense amplifiers can be "single-bit" sense amplifiers as single-bit SAs can have a simple circuitry, consumes less power and have a smaller area than other options, such as multi-bit SAs or ADCs. The next row illustrates the output of the digital summation circuit (DSC), which sums up the outputs of the from left to right, increasing the total by 1 for a 1 result for the sense amp, and decreasing the count by 1 for a 0 result at the sense amp. In this example, the accumulated output of the original DSC is −4. However, this value is incorrect due to the 0 weight values, giving −4 rather than the correct value of −1. To rectify this value and account for the 0 weights, a modified DSC receives the number of 0 weights along the bit line from a zero weight register (ZWR) that has the number of 0 weights along each of the bit lines. This value is used to initialize the modified DSC. In the example of 26, the number of weights is 3 and, when initialized with this value, the modified DSC provides the correct accumulated value of −1.

FIG. 27 is a block diagram of a modified digital summation circuit to provide the correct output with ternary weights. The modified DSC 2113 presented in FIG. 27 is connected to the ZWR 2131 that holds a number of 0 weights that is associate with the counter of each bit line. The content of ZWR 2131 is used to initialize the original DSC. As a result, the modified DSC 2113 can provide the correct partial sum by eliminating the impact of zero weights on the values received from the sense amp outputs and provide the corrected accumulated count on to the output buffer. The content of ZWR 2131 can be pre-determined before inferencing data by counting the number of zero weights in each bit line after the kernel transformation. The values can be loaded in, either before, after, or at the same time as the transformed weights are loaded in the memory array.

FIG. 28 is a flowchart for an embodiment of an inferencing operation using ternary weight valued filters. The process begins before inferencing at step 2801 with a memory array in which the ternary valued trained weights of the transformed filter kernels and the zero weight register values are preloaded. More detail on this process is described below with respect to FIG. 29. Although the following is described for the use with transformed filter kernels, it can also be applied to other ternary valued filters, but then the add/subtraction steps used to reverse the kernel transformations are omitted. At step 2803 the modified DSCs ($2113_i$ of FIGS. 21 and 22) are initialized by the corresponding values from ZWR 2131.

At step 2805, the input feature maps are provided to the memory array by pre-charging the word line pairs to their proper voltage levels (V/0) or (0/N) and applying the word line voltages to the array. Referring to FIGS. 21 and 22, the input buffer 2127 would sequentially receive the series of input values, which are then applied by the word line decoder 2129 to the word line pairs $WL_j$ $2107_j$, $WLB_j$ $2108_j$. As the word line pairs span the array block, the input is applied at the same time to the corresponding memory cell pair $2101_{i,j}$ on each bit line $BL_i$ $2105_i$. Depending on the input value and the stored weight value, each bit line will have a current of either small Icell or large Icell. For the embodiment of FIG. 21 with the analog add/subtraction circuits $2151_i$, the currents in bit line $BL_i$ $2105_i$ and bit line $BL_{i+1}$ $2105_{i+1}$ are added and subtracted at step 2807 and passed on to the respective sense amplifiers $SA_i$ $2111_i$ and $SA_{i+1}$ $2111_{i+1}$. For the embodiment of FIG. 22, step 2807 is skipped and the currents in bit line $BL_i$ $2105_i$ and bit line $BL_{i+1}$ $2105_{i+1}$ are directly passed on to the respective sense amplifiers $SA_i$ $2111_i$ and $SA$ $2111_{i+1}$.

When the array is read, the input-weight product is shown as small/large Icell currents on the bit lines, which are sensed by sense amplifiers $SA_i$ $2111_i$ to give '0' and '1' logic values, respectively, at step 2809. At step 2811 the modified digital summation circuits $2123_i$ accumulate the sense amplifiers' output logic, then provide partial sum of the convolution, stating with incremented values loaded at step 2803. As described with respect to FIG. 26, if the DSC is decremented/incremented with respect to the sense amplifiers' outputs ('0'/'1') without the initial incrementation value, it would provide the wrong partial sum due to incorrectly decrementing the 0 weights.

For the embodiment of FIG. 22 using digital add/subtraction circuits 2153$_i$, at step 2813 the outputs of the modified digital summation circuits 2123$_i$ and 2123$_{i+1}$ are added and subtracted before being passed on to the output buffer 2123. For the embodiment of FIG. 21, step 2813 is skipped, the adding and subtracting having been previously performed in step 2807. At step 2815 the results of the results of the multiply and accumulation (MAC) operations for the CNN are buffered in the output buffer 2123 and can then be provided on to a host or used in the next stage of neural network.

FIG. 29 is a flowchart for an embodiment to determine and store the transformed kernels on a memory die and configure the zero-weight register of the memory die. Depending on the embodiment, a training engine can externally configure ZWRs during the training phase for the array; a host CPU, that may or may not be the same as training engine, can externally configure ZWRs before the inferencing phase; or the ZWRs can be configured internally by the inferencing engine before inferencing input data.

The flow of FIG. 29 begins at step 2901 with the training of a neural network by a training engine. For example, step 2901 can correspond to the flow of FIG. 7A leading up to step 711. Once the filters with binary valued weights are determined or received, at step 2903 the kernel transformations are performed. The kernel transformations can be performed in a number of ways by taking linear combinations of the binary valued filter kernels to generate the transformed ternary valued filter kernels. In the embodiments described above, this is done by taking pairs of binary valued kernels and forming ½ of their sum and ½ of their difference:

FK1'=(FK1+FK2)/2; and

FK2'=(FK1−FK2)/2.

In one set of embodiments, the filter kernels can just be paired for transformation based on their order as received or generated. In other embodiments, the pairing can be optimized to result in an increase number of 0 valued weights, as discussed in more detail with respect to FIG. 30.

Once the ternary valued weights of the transformed kernels are known, along with how these weights will be stored on an array, the number of 0 weights per bit line can be determined at step 2905. Once the ternary valued weights and the number of 0 weights per bit line are determined at steps 2903 and 2905, the weights can be written into the die at step 2907 and the register values of ZWR 2131 configured at step 2909 to hold the number of 0 weights for each bit line. Although the flow of FIG. 29 is ordered to show the memory array being configured to store the weights at step 2907 before configuring the ZWR at step 2909, in other embodiments the weights can be written into the array before step 2905, or after or concurrently with step 2909. Once the ternary valued weights are stored in the array and the ZWR configured, the memory array is ready for inferencing.

FIG. 30 is a flowchart of one embodiment to generate transformed filter kernels with an optimized (e.g., maximum) number of 0 weights. More specifically, FIG. 30 presents more detail on an embodiment for step 2901 and a determination of the kernel pairs for step 2903 of FIG. 29. In order to maximize the power reduction provided by the kernel transformation the set of filter pairs should be chosen to have a maximal total number of common shared coefficients. This problem is equivalent to finding a set of filter pairs with a minimum total Hamming distances (between filter kernels) which are stored in a cost matrix [C], where the matrix [C] is a symmetric matrix in which c[i, j] (0≤i, j<N, where N is the number of filter kernels per channel) represents the normalized Hamming distance between original filter kernel i and kernel j.

Starting at step 3001, the CNN structure and data set are received. From the CNN structure and data, the training of steps 3003 and 3005 can be conducted by a training neural network with a training engine, or by a GPU and CPU configured for this purpose. Depending on the embodiment, the training can be done by a host or other external device connected to provide the results to the memory system, performed by the memory system, or some combination of these. For example, the training process is often performed in the cloud, allowing additional or more powerful processing to be accessed. In the flow of FIG. 30, in step 3003 the CNN is trained binary input values of (−1, +1) and binary weight values of (−1, +1), achieving the trained binary valued filter kernels of the CNN's layers at step 3005.

Steps 3007 and 3009 are post training processes to maximize number of zero weights existing in the transformed kernel filters. Step 3007 constructs the cost matrix [C] that stores the Hamming distances of the filter pairs being transformed, with the filter pairs with the minimum total cost determined at step 3009. In one set of embodiments, at step 3009 it is possible to solve the problem by using a classical and simple "Hungarian algorithm" to find a set of filter pairs with total minimum cost. Depending on the number of original filter kernels involved, a "Hungarian algorithm" can be implemented using cost array or bipartite graph techniques.

Once the filter pairs are determined, the flow can continue on with step 2903 of FIG. 29 to calculate the transformed ternary valued kernels and on to the subsequent steps of FIG. 29.

As described above, the use filter kernel transformation techniques can be used to reduce the power consumption of a binary input, binary weight in-memory CNN inference engine. The kernel transformation techniques encode the weights existing in the convolutional filters of CNN into a ternary (−1, 0, +1) format. The described architecture for the storage class memory array and input/output circuits can leverage the ternary weights to reduce the power consumption of CNN inference engines.

According to a first set of aspects, a non-volatile memory device includes a plurality of non-volatile memory cells and one or more control circuits connected to the non-volatile memory cells. The plurality of non-volatile memory cells are configured to store a plurality of ternary valued weights of one or more filters of a convolutional neural network, each of the ternary valued weights stored in a pair of memory cells connected to a corresponding pair of word lines and connected on a common bit line. The one or more control circuits are configured to: receive a plurality of binary inputs for a layer of a neural network; convert each of the plurality of binary inputs into a corresponding one of a pair of voltage patterns; apply the plurality of voltage patterns to the non-volatile memory cells to thereby perform an in-memory multiplication of the plurality of binary inputs with the ternary valued weights; and accumulate results of the in-memory multiplication.

In additional aspects, a method includes receiving a plurality of binary valued filters for a convolution neural network. The plurality of binary valued filters are transformed to a plurality of ternary valued filters, each of the ternary valued filters being a linear combination of a plurality of binary valued kernels and having a plurality of ternary valued weights. The ternary valued filters are stored in a non-volatile memory array configured to provide a result of a convolution of a vector of binary input values with the binary valued filters by applying a set of voltage values corresponding to the vector of binary input values to the memory array.

Further aspects include a non-volatile memory circuit having one or more bit lines, a plurality of word line pairs, and a plurality of pairs of non-volatile memory cells each connected to one of the bit lines and one of the word line pairs, the memory cell pairs configured to store a ternary valued weight of a filter of a convolutional neural network, each weight stored in a pair of memory cells connected to a corresponding word line pair. The non-volatile memory circuit also includes one or more sense amplifiers that are each connected to a corresponding one of the bit lines and configured to determine a current level of the corresponding bit line in response to one of a plurality of voltage patterns applied to one of the word line pairs connected to the corresponding bit line. The non-volatile memory circuit further includes: a register configured to hold, for each of the one or more bit lines, a value indicating a number of the pairs of memory cells connected to the bit line storing a zero weight value; and one or more summation circuits each connected to one of the sense amplifiers and to the register, the summation circuit configured to increment a count for each of the bit lines in response to a current determined by the corresponding sense amplifier and to alter the count in response to the value indicating the number of the pairs of memory cells connected to the corresponding bit line storing the zero weight value.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
a plurality of non-volatile memory cells configured to store a plurality of ternary valued weights of one or more filters of a convolutional neural network, each of the ternary valued weights stored in a pair of memory cells connected to a corresponding pair of word lines and connected on a common bit line;
a register connected to the one or more control circuits and configured to store a number of zero valued weights stored in the memory cells connected along the common bit line; and
one or more control circuits connected to the non-volatile memory cells, the one or more control circuits configured to:
receive a plurality of binary inputs for a layer of a neural network;
convert each of the plurality of binary inputs into a corresponding one of a pair of voltage patterns;
apply the plurality of voltage patterns to the non-volatile memory cells to thereby perform an in-memory multiplication of the plurality of binary inputs with the ternary valued weights;
accumulate results of the in-memory multiplication; and
compensate the accumulated results of the in-memory multiplication based on the number of zero valued weights stored in the memory cells connected along the common bit lines.

2. The non-volatile memory device of claim 1, wherein a zero valued weight is stored in a pair of memory cells as a high resistance state for both memory cells of the pair of memory cells.

3. The non-volatile memory device of claim 1, wherein the one or more filters of a convolutional neural network include a pair of filters of the convolutional neural network, the weights of a first of the pair of filters stored on a first bit line and the weight of a second of the pair of filters stored on a second bit line, the one or more control circuits further configured to:
form a sum of the results of the accumulated results of the in-memory multiplication from the first bit line and the accumulated results of the in-memory multiplication from the second bit line; and
form a difference of the results of the accumulated results of the in-memory multiplication from the first bit line and the accumulated results of the in-memory multiplication from the second bit line.

4. The non-volatile memory device of claim 3, further comprising:
an analog add/subtraction circuit connected to the first bit line and the second bit line to form the sum and the difference.

5. A method, comprising:
receiving a plurality of binary valued filters for a convolution neural network;
transforming the plurality of binary valued filters to a plurality of ternary valued filters, each of the ternary valued filters being a linear combination of a plurality of binary valued kernels and having a plurality of ternary valued weights; and storing the ternary valued filters in a non-volatile memory array configured to provide a result of a convolution of a vector of binary input values with the binary valued filters by applying a set of voltage values corresponding to the vector of binary input values to the memory array.

6. The method of claim 5, wherein storing the ternary valued filters in the non-volatile memory array comprises:
storing each of the weights in a pair of memory cells of the memory array.

7. The method of claim 6, wherein storing each of the weights in a pair of memory cells of the memory array includes:
storing zero valued weights as a high resistance state in both of the memory cells of the pair.

8. The method of claim 5, wherein the memory array includes a plurality of bit lines each connected to a plurality of memory cells, the method further comprising:
determining a number of zero valued weights stored along each of the bit lines; and
store the number of zero valued weights stored along each of the bit lines in a register on the memory array.

9. The method of claim 5, wherein transforming the plurality of binary valued filters to a plurality of ternary valued filters includes:
forming pairs of ternary valued filters from corresponding pairs of binary valued filters by forming a bit-wise sum of the corresponding pair of binary valued filters and forming a bit-wise difference of the corresponding pair of binary valued filters.

10. The method of claim 9, wherein forming pairs of ternary valued filters from corresponding pairs of binary valued filters includes:
from a plurality of binary valued filters, determining the corresponding pair of binary filter for a pair of ternary valued filters by optimizing a number of zero valued weights in the pair of ternary valued filters.

11. The method of claim 10, wherein optimizing the number of zero valued weights in the pair of ternary valued filters is based upon a cost function of the plurality of binary valued filters.

12. A non-volatile memory circuit, comprising:
one or more bit lines;
a plurality of word line pairs;
a plurality of pairs of non-volatile memory cells each connected to one of the bit lines and one of the word line pairs, the memory cell pairs configured to store a ternary valued weight of a filter of a convolutional neural network, each weight stored in a pair of memory cells connected to a corresponding word line pair;
one or more sense amplifiers each connected to a corresponding one of the bit lines and configured to determine a current level of the corresponding bit line in response to one of a plurality of voltage patterns applied to one of the word line pairs connected to the corresponding bit line;
a register configured to hold, for each of the one or more bit lines, a value indicating a number of the pairs of memory cells connected to the bit line storing a zero weight value; and
one or more summation circuits each connected to one of the sense amplifiers and to the register, the summation circuit configured to increment a count for each of the bit lines in response to a current determined by the corresponding sense amplifier and to alter the count in response to the value indicating the number of the pairs of memory cells connected to the corresponding bit line storing the zero weight value.

13. The non-volatile memory circuit of claim 12, further comprising:
one or more add/subtraction circuits, each connected to receive an output from each of a corresponding pair of bit lines and configured to form a sum of the outputs from the corresponding pair of bit lines and to form a difference of the outputs from the corresponding pair of bit lines.

14. The non-volatile memory circuit of claim 13, wherein each of the one or more add/subtraction circuits is connected between the corresponding pair of bit lines and the sense amplifiers corresponding to the corresponding pair of bit lines.

15. The non-volatile memory circuit of claim 14, wherein the one or more add/subtraction circuits are analog circuits.

16. The non-volatile memory circuit of claim 15, wherein each of the one or more add/subtraction circuits comprise:
a plurality of current mirrors.

17. The non-volatile memory circuit of claim 13, further comprising:
an output buffer,
wherein each of the one or more add/subtraction circuits is a digital add/subtraction circuit configured to receive the count corresponding to the corresponding pair of bit lines and provide the sum and difference to the output buffer.

18. The non-volatile memory circuit of claim 12, wherein the non-volatile memory circuit is configured to store a zero weight value in a memory cell pair as a high resistance state for both of the memory cells of the memory cell pair.

19. The non-volatile memory circuit of claim 12, wherein each of the summation circuits are configured to alter the count in response to the value indicating the number of the pairs of memory cells connected to the corresponding bit line storing the zero weight value by initializing the count to the number of the pairs of memory cells connected to the corresponding bit line storing the zero weight value.

* * * * *